United States Patent
El Gamal et al.

(10) Patent No.: US 11,256,567 B2
(45) Date of Patent: *Feb. 22, 2022

(54) HARD AND SOFT BIT DATA FROM SINGLE READ

(71) Applicant: SanDisk Technologies LLC, Addison, TX (US)

(72) Inventors: Mostafa El Gamal, Worcester, MA (US); James Fitzpatrick, Irvine, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,669

(22) Filed: Jun. 22, 2020

(65) Prior Publication Data

US 2020/0319965 A1  Oct. 8, 2020

Related U.S. Application Data

(63) Continuation of application No. 16/147,341, filed on Sep. 28, 2018, now Pat. No. 10,733,047.

(51) Int. Cl.
*G11C 29/00* (2006.01)
*G06F 11/10* (2006.01)
(Continued)

(52) U.S. Cl.
CPC ...... *G06F 11/1068* (2013.01); *G11C 11/5642* (2013.01); *G11C 16/26* (2013.01); *G11C 29/52* (2013.01)

(58) Field of Classification Search
CPC .. G06F 11/1068; G06F 11/5642; G11C 29/52; G11C 16/26
See application file for complete search history.

(56) References Cited

U.S. PATENT DOCUMENTS 8,947,929 B1   2/2015  Yang
9,053,804 B2   6/2015  Wu et al.
(Continued)

OTHER PUBLICATIONS

Zuolo et al., "LDPC Soft Decoding with Reduced Power and Latency in 1X-2X NAND Flash-Based Solid State Drives," https://ieeexplore.ieee.org/document/7150293/citations?tabFilter=papers.
(Continued)

*Primary Examiner* — Samir W Rizk
(74) *Attorney, Agent, or Firm* — Vierra Magen Marcus LLP

(57) ABSTRACT

An apparatus includes memory cells programmed to one of a plurality of data states, wherein the memory cells are configured such that the plurality of data states comprise an error-prone data state. Sense circuitry of the apparatus is configured to sense first memory cells programmed to the error-prone data state, determine a bit encoding for the first memory cells, sense other memory cells programmed to other data states, and determine a bit encoding for the other memory cells. A communication circuit of the apparatus is configured to communicate the bit encoding for the other memory cells, the bit encoding for the first memory cells, and an indication that the first memory cells are programmed to the error-prone data state, in response to a single read command from a controller.

20 Claims, 11 Drawing Sheets

SOFT BIT DATA FROM SINGLE READ USING ADDITIONAL SENSE

(51) Int. Cl.
    *G11C 29/52*     (2006.01)
    *G11C 11/56*     (2006.01)
    *G11C 16/26*     (2006.01)

(56)         References Cited

U.S. PATENT DOCUMENTS

| | | |
|---|---|---|
| 9,659,637 B2 | 5/2017 | Song et al. |
| 2004/0136236 A1 | 7/2004 | Cohen |
| 2008/0244360 A1 | 10/2008 | Mokhlesi et al. |
| 2009/0116288 A1 | 5/2009 | Varkony |
| 2013/0070526 A1* | 3/2013 | Eun .................... G11C 11/5642 |
| | | 365/185.03 |
| 2013/0139035 A1 | 5/2013 | Zhong et al. |
| 2014/0040531 A1 | 2/2014 | Wu et al. |
| 2014/0281828 A1 | 9/2014 | Micheloni et al. |
| 2015/0006791 A1 | 1/2015 | Too et al. |
| 2015/0029796 A1 | 1/2015 | Choi et al. |
| 2016/0006462 A1 | 1/2016 | Hanham et al. |
| 2020/0104209 A1 | 4/2020 | El Gamal et al. |

OTHER PUBLICATIONS

Non-Final Office Action dated Dec. 31, 2019, U.S. Appl. No. 16/147,341, filed Sep. 28, 2018.
Response to Office Action dated Mar. 3, 2020, U.S. Appl. No. 16/147,341, filed Sep. 28, 2018.
Notice of Allowance dated Apr. 3, 2020, U.S. Appl. No. 16/147,341, filed Sep. 28, 2018.

* cited by examiner

HARD AND SOFT BIT DATA FROM SINGLE READ

CLAIM OF PRIORITY

This application is a continuation application of U.S. patent application Ser. No. 16/147,341, entitled "HARD AND SOFT BIT DATA FROM SINGLE READ," by El Gamal et al., filed Sep. 28, 2018, published as US 2020/0104209 on Apr. 2, 2020 and issued as U.S. Pat. No. 10,733,047 on Aug. 4, 2020, incorporated by reference herein in its entirety.

BACKGROUND

Field

This disclosure relates to computing devices. More particularly, the disclosure relates to systems and methods for decoding data stored in data storage media.

Description of Related Art

In certain computing systems, such as solid-state data storage systems, data can be stored in memory by charging the cells to programming voltage levels. The ability to correctly decode data stored in memory cells can impact system performance.

SUMMARY

In some implementations, the present disclosure relates to an apparatus comprising a plurality of memory cells configured to be programmed to one of a plurality of data states. The plurality of data states comprise one or more error-prone data states. The apparatus further comprises sense circuitry configured to sense the memory cells at a plurality of read levels and determine a bit encoding for the memory cells. The apparatus further comprises a communication circuit configured to communicate, in response to a single read command, the bit encoding for the memory cells and an indication that a subset of the memory cells between a pair of read levels of the plurality of read levels are programmed to the one or more error-prone data states.

The communication circuit may be configured to communicate the bit encoding and the indication in a single communication message. In some embodiments, the communication circuit communicates the indication in an intermediate data transfer and communicates the bit encoding in a final data transfer. The communication circuit may communicate the indication before communicating the bit encoding for the plurality of memory cells. In some embodiments, the one or more error-prone data states comprises a plurality of adjacent data states having a common bit encoding for at least one page. In some embodiments, the plurality of read levels are positioned at symbol boundaries and the sense circuitry is further configured to sense the plurality of memory cells at an additional soft read level in response to the read command.

In some implementations, the present disclosure relates to an apparatus comprising a plurality of multi-level memory cells, a communication interface configured to couple the apparatus to a memory controller, and sense circuitry. The sense circuitry is configured to execute a single page read operation by performing a first sense operation to sense the memory cells at a first read level, transmitting reliability data over the communication interface, performing a second sense operation to sense the memory cells using a second read level, and transmitting hard bit data indicating data stored in the plurality of memory cells over the communication interface.

The apparatus may further comprise first and second sets of data latches, wherein the sense circuitry is further configured to store first values based on the first sense operation in the first set of data latches, store second values based on the second sense operation in the second set of data latches, execute a logical operation on the first values and the second values to generate additional values, and store the additional values in the first set of data latches, thereby overwriting the first values.

In some embodiments, the reliability data comprises the first values. In some embodiments, the reliability data comprises the additional values. The sense circuitry may be further configured to perform a third sense operation to sense the memory cells using a third read level, store third values based on the third sense operation in the second set of data latches, execute a logical operation on the third values and values stored in the first set of data latches to generate fourth values, and store the fourth values in the first set of data latches, thereby overwriting the first set of data latches. For example, the reliability data may comprise the third values or and/or the fourth values. In some embodiments, the hard bit data comprises the fourth values.

In some embodiments, the memory cells are programmed to a first plurality of programming groups associated with a first bit value and a second plurality of programming groups associated with a second bit value, and the reliability data indicate a subset of the memory cells that are programmed to one programming group of the first plurality of programming groups. For example, the first read level may distinguish an erase programming state from non-erase programming states and one or more programming states of the subset of the first plurality of the programming states may overlap with an erase tail associated with the erase programming state. In some embodiments, the sense circuitry is configured to transmit the reliability data as an intermediate transfer.

In some implementations, the present disclosure relates to a system comprising a communication bus, a memory controller, and a non-volatile memory die electrically coupled to the memory controller via the communication bus. The non-volatile memory die comprises a plurality of memory cells and control circuitry. The control circuitry is configured to, in response to a single read command received from the memory controller, sense the plurality of memory cells using a first read level, sense the plurality of memory cells using a second read level, at a first time, transmit soft bit data based on the first read level to the memory controller, and, at a second time after the first time, transmit hard bit data based on the first read level and the second read level to the memory controller.

The memory controller may comprise a decoder configured to receive the soft bit data and the hard bit data and decode the plurality of memory cells based at least in part on the soft bit data and the hard bit data. For example, in some embodiments, the decoder is configured to generate reliability values based on the soft bit data and decoding the plurality of memory cells is based at least in part on the reliability values.

BRIEF DESCRIPTION OF THE DRAWINGS

Various embodiments are depicted in the accompanying drawings for illustrative purposes and should in no way be interpreted as limiting the scope of this disclosure. In addition, various features of different disclosed embodiments can be combined to form additional embodiments, which are part of this disclosure.

DETAILED DESCRIPTION

Figure 1:
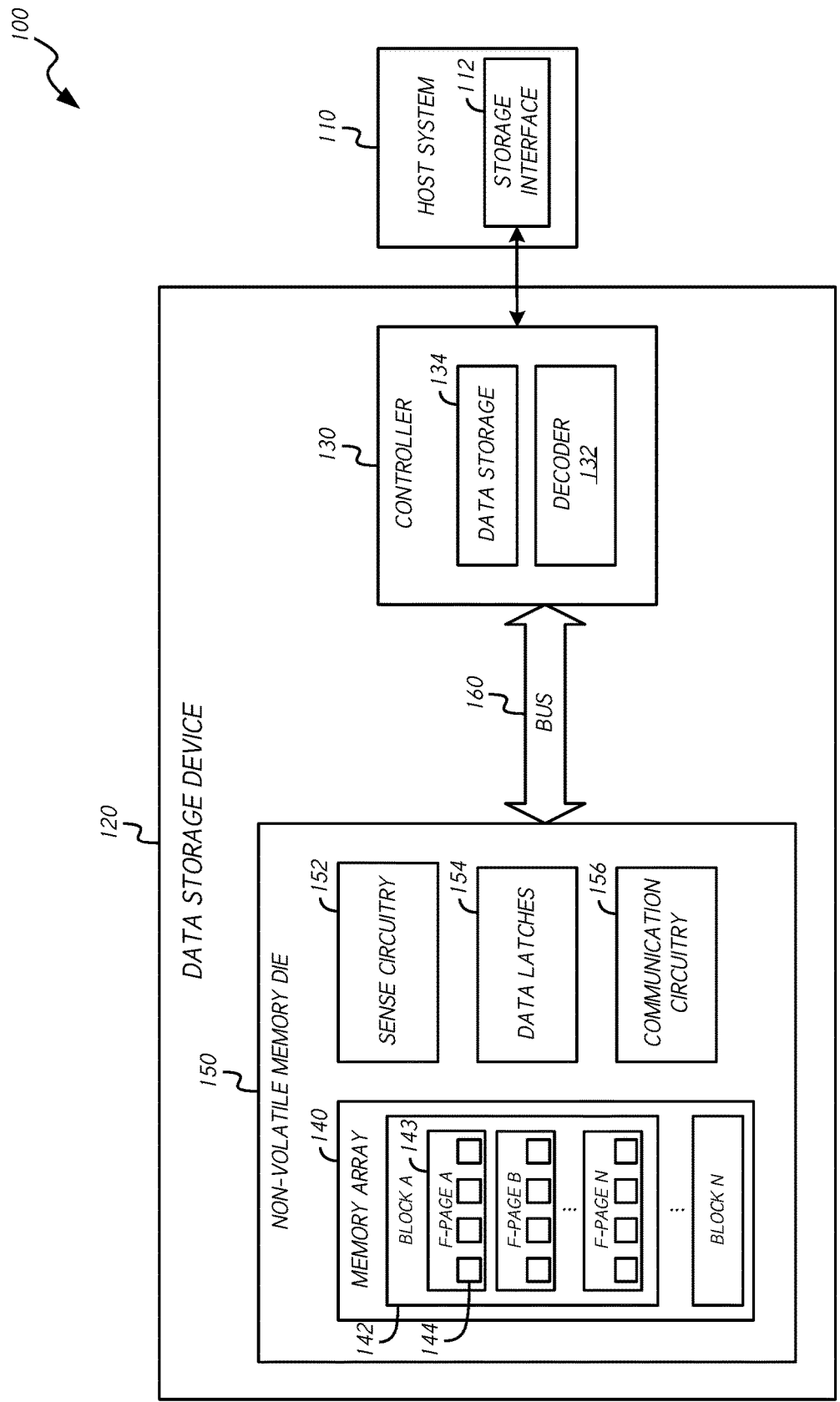
FIG. 1 is a block diagram of a data storage system in accordance with one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to hard and soft bit data generation in computing devices, such as solid-state data storage devices.

Overview

In solid-state data storage devices and systems, memory cells or storage elements are programmed/altered with a characteristic that is representative of stored data. Sense operations can be executed to determine the programmed characteristic of memory cells, such that a sense operation returns a sense result indicating the programmed characteristic. For example, with respect to solid-state data storage implementing floating-gate transistors, such as NAND architectures, memory cells or storage elements can include a floating-gate transistor configured to store an electrical charge characteristic. To store information in such memory cells, a charge level is written to the cell by adding a specified amount of charge to a floating gate of the transistor. A sense operation is executed to read the memory cell, wherein the sense operation involves determining the charge level of the cell and the encoding associated with the charge level. For example, the charge level of the cell can be sensed by applying a read level voltage to a control gate of the floating-gate transistor and determining whether current flows through the transistor, which indicates whether the charge level of the transistor (i.e., the characteristic of the memory cell) is greater than or less than the read level.

Although certain embodiments are disclosed herein in the context of floating-gate-based data storage for convenience, it should be understood that the principles disclosed are applicable to other types of solid-state data storage solutions as well. For example, certain solid-state data storage solutions have a programming characteristic that is related to a charge level in a capacitor that is sensed to provide a sense result indicating the data stored therein. As another example, magnetoresistive data storage (e.g., magnetoresistive random-access memory (MRAM)) implements memory cells that have a programming characteristic that is related to magnetic anisotropy energy, or polarity, stored in magnetic storage elements. In some embodiments, the resistance of the magnetoresistive element defines the characteristic of the memory cell (e.g., the bit encoding state). Therefore, references herein to sensing or determining a charge level of a memory cell are applicable to determination of a sense characteristic of any type of memory cell, including magnetoresistive memory cells.

The terms "characteristic," "programming characteristic," and "sense characteristic," as used herein in the context of memory cells, may refer to any charge level, state, voltage, voltage level, electrical current, magnetic or electrical resistance, hysteresis, or any other state, condition, or property that may be maintained by a memory cell or element that indicates a programmed state thereof. Furthermore, a "characteristic" may refer to the particular type of characteristic used to encode data (e.g., charge level, current, resistance, etc.), or to a particular value or state of the characteristic (e.g., particular distinct charge state among a range or plurality of possible charge state, or a particular state of a magnetic cell among a plurality of possible states). The term "sense operation" is used herein according to its broad and ordinary meaning, and may refer to any step, action, operation, mechanism, or functionality implemented to determine/read a sense characteristic of a memory cell. A determined/read sense characteristic of a memory cell, and/or a bit encoding associated therewith, may be referred to herein as a "sense result."

The present disclosure provides systems, devices, and methods for decoding data in a solid-state data storage device. In certain embodiments, solid-state storage elements (e.g., memory cells) may be decoded using soft-decision data. Soft-decision decoding may be desirable in order to utilize the capabilities of certain relatively-powerful error correction codes (ECCs) used in solid-state memory (e.g., flash memory), such as low-density parity check (LDPC) codes. Soft-decision decoding can provide improved decoding capacity/capability when compared to traditional hard decision algebraic codes (e.g., BCH) in in some implementations.

In order to generate soft-decision input values (e.g., log likelihood ratios (LLRs)), a solid-state memory controller may send a plurality of read commands to a solid-state memory die, each of the read commands indicating a plurality of voltage read levels. For example, a first hard decision read command may be executed, wherein, if hard decision decoding based on the first hard decision read command fails, one or more additional soft decision read commands may be executed. The use of additional read commands may provide additional reliability information related to the programming/data states of the memory cells when compared to hard decision decoding, which may only utilize input values based on a single read command. However, multiple reads can be relatively expensive in terms of performance and/or throughput. Therefore, it may be desirable for a decoding scheme to perform decoding using a minimum number of read commands in order to improve the performance and throughput of the system.

The present disclosure relates to systems, devices, and methods for decoding and/or sensing solid-state storage elements, such as memory cells. In certain solid-state data storage systems, multiple bits of data can be stored in individual memory cells by precisely programming or charging respective cells to distinct programming voltages. For example, with respect to floating-gate memory, where a voltage charge level can be stored in the floating gate of a memory cell as a programming characteristic of the memory cell, each distinct programming charge level (or distinct states or characteristics of the particular programming characteristic) may correspond to a distinct bit encoding (e.g., one or more bits of data). Sensing whether the charge level of a memory cell is greater than one or more read thresholds within its range can indicate the cell's state, thus allowing recovery of a stored data value. Where more than two distinct programming voltage levels are implemented, multiple bits of data can be stored in a single cell. However, variations in semiconductor (e.g., silicon) processes, and/or other hardware, software, and/or system factors or trade-offs can result in at least some cells of a solid-state memory array being over- or under-programmed with respect to the target programming voltage.

The data-encoding charge level of a memory cell may vary over time due to cell damage, charge leakage, temperature effects, disturbances from nearby cells, or the like. An error may occur if the charge level of the cell migrates from one programming/data state charge range into an adjacent state charge range. As storage density increases, feature size shrinks, making the cells more susceptible to such disturbances, and increasing error rates. Encoding data for storage with error correcting codes may at least partially compensate for such errors.

Error correction coding (ECC) can be used to correct errors resulting from storage cells that are mis-programmed (e.g., over- or under-programmed). As referenced above, some decoder solutions are configured to implement low-density parity check (LDPC) coding, which may allow for the use of soft bit data about read bit encodings to enhance correction capability. However, acquiring soft bit data can require executing multiple reads (i.e., read commands) of a word line with adjusted voltage read levels. The time and/or cost associated with such soft bit data acquisition can be undesirably or prohibitively long, and so soft bit data may be used only in relatively rare cases, such as in response to failure of hard bit decoding.

In some implementations, the present disclosure provides systems, devices, and/or processes for measuring/acquiring soft bit data for use in error correction decoding in a relatively efficient manner. For example, in some implementations, the present disclosure provides for soft bit data measurement/determination together with hard bit data as part of execution of a single read operation. That is, a solid-state memory die in accordance with embodiments of the present disclosure may be configured to provide soft bit data and hard bit data in response to a single read command, such as a read command received from a memory controller die, chip, or module. Embodiments of the present disclosure may thereby enable relatively higher, real-time/on-the-fly error correction functionality with relatively little overhead required for soft bit data determination. Therefore, solutions presented herein can provide for improved error-correction capability of a memory controller decoder for a single page read, which may help to extend the endurance of the data storage device and/or reduce read latency associated therewith.

As used in this application, "non-volatile solid-state memory," "non-volatile memory," "NVM," "solid-state memory," "solid-state data storage," or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Solid-State Data Storage System

FIG. 1 is a block diagram illustrating a data storage system 100 comprising a combination of a host system 110 with a data storage device 120 incorporating soft decision decoding functionality in accordance with embodiments of the present disclosure. As shown, the data storage device 120 (e.g., hybrid hard drive, solid-state drive, any storage device utilizing solid-state memory, etc.) includes a controller 130 configured to receive data commands and to execute such commands in the non-volatile memory die 150. Such commands may include data read/write commands, and the like. The controller 130 may be configured to receive data commands from a storage interface (e.g., a device driver) 112 residing on the host system 110. Data commands may specify a block address in the data storage device 120; data may be accessed/transferred based on such commands.

The data storage device 120 can store data received from the host system 110, such that the data storage device 120 acts as data storage for the host system 110. To facilitate this function, the controller 130 may implement a logical interface. The logical interface can present memory to the host system as a set of logical addresses (e.g., sequential/contiguous addresses) where data can be stored. Internally, the controller 130 can map logical addresses to various physical memory addresses in the non-volatile solid-state memory die 150 and/or other memory die/module(s). Mapping data indicating the mapping of logical addresses to physical memory addresses may be maintained in the data storage device 120. For example, mapping table data may be stored in the non-volatile memory array 140 in order to allow for recreation of mapping tables following a power cycle.

In certain embodiments, the memory array 140 comprises one or more blocks of storage, identified as Block "A" 142 through Block "N." Each block may comprise a plurality of flash pages (F-pages). For example, Block A 142 of FIG. 1 includes a plurality of F-pages, identified as F-pages "A" 143, B, through "N." In some embodiments, each F page is a smallest grouping of storage elements (e.g., memory cells) in the non-volatile memory array 140 that can be programmed in a single operation or as a unit. Further, each F page may include a plurality of code words, such as error-correcting pages (E pages). In the illustrated embodiment, each F-page includes four E-pages that are illustrated as four boxes, including E-page 144. Other embodiments may use F pages or E pages that are defined differently or each F-page may include greater or fewer than four E-pages. The memory cells of the memory array 140 may have a three-dimensional (3D) memory (e.g., 3D NAND) configuration, or a two-dimensional (2D) memory configuration. Although certain embodiments are disclosed herein as comprising solid-state memory cells, it should be understood that such embodiments may comprise any type of storage elements.

The controller 130 includes a decoder 132 configured to implement decoding and error correction functionality with respect to data reads from the non-volatile memory die 150. For example, the decoder 132 may serve to read and interpret data stored on the memory array 140. The decoder 132 and/or controller 130 may be configured to perform decoding and error correction according to any desirable method or combination of methods, such as forward-error correction (FEC) methods, including Bose-Chaudhuri-Hocquenghem (BCH) and Reed-Solomon (RS), which may utilize primarily hard decision input.

In some embodiments, the controller 130 may be configured to implement error-correction coding (ECC). Such coding may utilize redundancy that allows the decoder 132 to detect a limited number of errors that may occur the data received from the memory die 150. Error-correction coding may allow the decoder 132 to correct errors resulting from memory cells of the memory array 140 that are mis-programmed. For example, in some embodiments, the decoder 132 is configured to implement low-density parity check (LDPC) decoding, wherein the decoder 132 maintains and/or utilizes soft bit data relating to memory cells being decoded to enhance the correction capability of the decoder 132. In response to a read command, the non-volatile memory die 150 may be configured to sense charge levels or other characteristics of cells of the memory array 140, and further transmit data comprising the bit encodings associated with the sensed charge levels and/or any soft bit data determined by the sense circuitry 152 to the controller 130 using the communication circuitry 156.

In certain embodiments, the non-volatile memory die 150 is a solid-state memory die (e.g., flash memory), wherein memory cells thereof store charge in transistor devices, such as floating-gate transistors. The cells of the memory array 140 may be programmed according to a single-level cell (SLC), multi-level cell (MLC), triple-level cell (TLC), quadruple-level cell (QLC), or other programming scheme presently known or later developed. In some contexts, the terms "multi-level cell" or "MLC" may be used to refer to any programming scheme providing more than two programming/data states, such as TLC, QLC, or any other such programming scheme. Certain embodiments are described herein in the context of a QLC programming scheme, in which a single cell is configured to store four bits of data. The memory die 150 may include any suitable solid-state non-volatile storage medium, including NAND flash memory cells and/or NOR flash memory cells. One example of the non-volatile memory die 150 may comprise a memory integrated circuit (IC) chip. The memory cells of the array 140 can be one-time programmable, few-time programmable, or many-time programmable. Also, the memory cells can be fabricated in a two-dimensional or three-dimensional configuration.

In certain embodiments, the decoder 132 is configured to receive hard bit data from the non-volatile memory die 150. For example, the controller 130 and/or decoder 132 may issue a read command (e.g., page read command) to the non-volatile memory die 150 requesting hard bit data associated with the read command. The term "hard bit data" as used herein refers to any data or information that provides a binary value (e.g., single bit) for a single memory cell based on a read result. Hard bit data is a binary value represented by a characteristic (e.g. electrical or physical) of the memory cell. For example, where data is stored in a solid-state memory cell, a sense operation may generate a sense result indicative of a current charge level or other characteristic of the memory cell. The sense result is used to decode the memory cell. Hard bit data may indicate the current charge level or other characteristic of the memory cell.

After receiving the hard bit data, the decoder 132 may attempt to decode the data using only the hard bit data. When the hard decision decoding is unsuccessful or fails, the controller 130 and/or decoder 132 may issue a follow-up read command indicating one or more shifted voltage read levels in order to determine or acquire additional soft bit data to aid in the decoding of the cells. Adjusted/shifted voltage read levels may be shifted to the right or to the left (i.e. increase or decrease voltage) as determined by the controller 130 and/or decoder 132. In response to the follow-up soft information read, the decoder 132 may receive additional read result data. The decoder 132 may compare the new read data with the previously-received hard bit data to determine a correct decoding. When the adjusted/shifted voltage read level(s) result in a changed or flipped bit value for a memory cell, such bit/cell may be marked or indicated as having relatively low reliability. Low reliability information may be interpreted by the decoder in decoding the data. The low reliability information may be considered soft bit data.

As referenced above, soft-decision decoders can achieve relatively high error correction performance by operating on "soft" data, such as log-likelihood ratio (LLR) inputs, which indicate a data value and a probability that the data value is correct, unlike hard-decision decoders, which operate on non-probabilistic "hard" data. Using additional read thresholds for "soft sensing" may provide additional "soft decision" data about a memory cell, which can be mapped to LLR values for a soft-decision decoder. For example, a data value from a cell may be considered more likely to be correct if soft bit data indicates that the charge level, or other characteristic, of the cell is in the middle of a state, and may be considered more likely to be in error if soft decision data indicates that the charge level of the memory cell is relatively near a boundary between states, such as a boundary that represents a symbol boundary for the relevant bit encoding and page being read. Memory cells near a boundary between states may have migrated from an adjacent state.

The terms "reliability data" and "reliability information" refer to any data or information that indicates a level of confidence or trust that the sensed/read hard bit data is accurate, and correctly reflects the data value that was originally stored in the memory cell. Reliability data conveys the level of trust relative to one or more other bits of read data or some other reference. Reliability data/information may further indicate the reliability or accuracy of one or more solid-state memory cells and/or a sense process associated with such cell(s). That is, reliability data/information may indicate a likelihood that one or more memory cells operate correctly. The term "soft bit data" is used herein refers to any data or information that, either alone or in combination with hard bit data, indicates a reliability level of sensed/read/recovered data and/or provides a non-binary value or interpretation of such data. For example, where data is stored in a solid-state memory cell, a sense operation may be implemented to generate a sense result indicative of a current charge level or other characteristic of the memory cell, wherein the sense result may be used to decode the memory cell. Soft bit data may indicate a probability or likelihood that the sense result accurately reflects the data actually written to the memory cell prior to the sense operation.

In some embodiments, the decoder 132 is a soft-decision decoder. Unlike hard-decision decoders, which generally operate on data that take on a binary set of possible values (typically '0' or '1') for a given bit/cell, the inputs to a soft-decision decoder may take on a range of values between maximum and minimum input values. This additional information provided by soft bit data can be used to form better estimates of the original data. Therefore, a soft-decision decoder will typically perform better in the presence of corrupted data than its hard-decision counterpart. In some embodiments, soft bit data comprising log likelihood ratio value data is generated by the non-volatile memory die 150 and/or controller 130. A log likelihood ratio (LLR) may indicate a degree of likelihood that given data is correct.

In some implementations, the non-volatile memory die 150 is configured to, in response to a single read command received from the controller 130, generate and transmit both hard and soft bit data. The decoder 132 can use the hard and soft bit data to generate a final decoding output. Embodiments of the present disclosure can advantageously allow for the determination of soft bit data in a relatively efficient manner, wherein the non-volatile memory die 150 is configured to determine soft bit data through one or more mid-read transfers of intermediate sensed data.

The non-volatile memory die 150, bus 160, controller 130, and/or other control circuitry, may be mounted or otherwise connected to one or more controller boards (not shown), such as printed circuit boards (PCBs) having certain circuit chips and/or discrete components mounted or otherwise connected thereto. The memory die 150 includes an array 140 (two-dimensional or three dimensional) of solid-state memory cells, sense circuitry 152, data latches 154, and communication circuitry 156.

The term "control circuitry" is used herein according to its broad and/or ordinary meaning, and may refer to any circuitry, module, device or component of the data storage device 120 configured to perform any of the functional aspects of the present disclosure. For example, one or any combination of the sense circuitry 152, the decoder 132, the communication circuitry 156, the controller 130, and/or portion(s) thereof can be referred to as "control circuitry." The control circuitry of the data storage device 120 may provide a means for limiting time and/or resource utilization associated with soft bit data generation in accordance with aspects of the present disclosure.

Programming State Distributions

Figure 2:
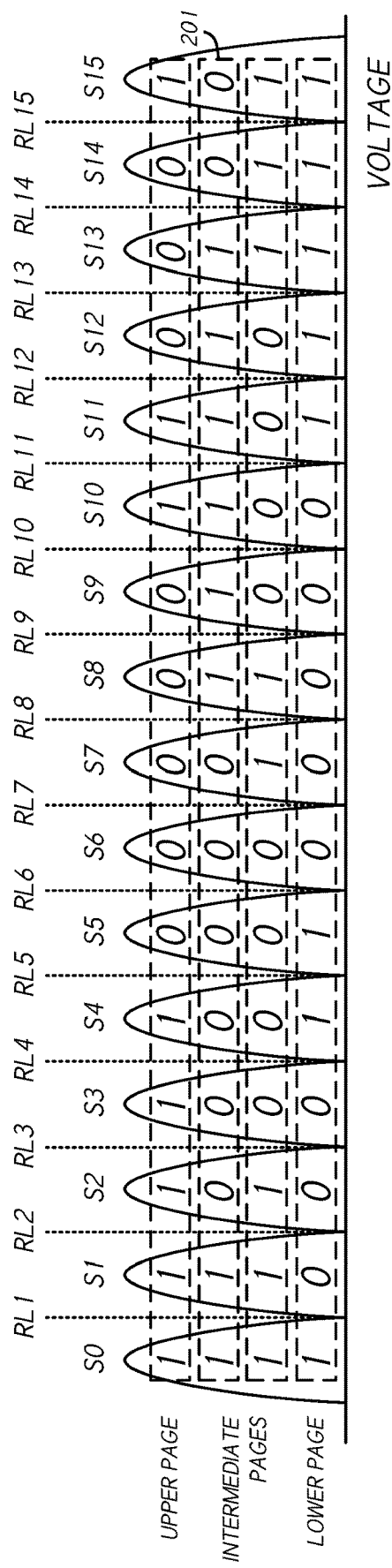
FIG. 2 is a graph illustrating a programming state distribution for memory cells in accordance with one or more embodiments.

FIG. 2 illustrates a graph showing a probability distribution of programmed cells in a non-volatile memory array according to one or more embodiments. The distribution of FIG. 2 is associated with a quadruple-level cell (QLC) programming scheme, in which four bits of information are stored in a single memory cell. However, it should be understood that systems and methods disclosed herein may be utilized with respect to other multi-level cell programming schemes.

FIG. 2 shows sixteen (16) programming/data states, including an erase state ('S0'), and fifteen (15) programming states ('S1'-'S15'), wherein each state represents four bits of data. In certain embodiments, the programming states (e.g., the bit encodings with programming states) each comprise a most-significant bit, referred to herein as the "lower page," a least-significant bit, referred to herein as the "upper page," and two intermediate pages. While particular coding values are assigned to the various states of the distribution (e.g., '1111' for 'S0,' '0111' for 'S1,' '0101' for 'S2,' '0001' for 'S3,' '1001' for 'S4,' '1000' for 'S5,' '0000' for 'S6,' '0100' for 'S7,' '0110' for 'S8,' '0010' for 'S9,' '0011' for 'S10,' '1011' for 'S11,' '1010' for 'S12,' '1110' for 'S13,' '1100' for 'S14,' and '1101' for 'S15'), other coding schemes may also be used within the scope of the present disclosure.

In decoding memory cells, one or more reference voltage levels, referred to herein as "voltage read levels," or simply, "read levels," may be used to read/sense the cells to determine what charge states the cells are programmed to, or what programmed state a memory cell is in based on a programmed characteristic thereof. FIG. 2 illustrates 15 voltage read levels, 'RL1'-'RL15.' For each page, only a subset of the read levels may be required to read the page. The read levels required to read the page depend on the symbol encoding applied to the data states of each logical page. The symbol encoding is the symbol represented by a particular state at a given range of memory cell characteristics. In certain embodiments, the binary symbols 0 and 1 are used. If the symbol encoding is the same for a set of adjacent data states, then reading at the read level between such states does not convey additional information.

Therefore, the read levels between states for which the symbol encoding changes are the read levels used for reading. These read levels are referred to herein as symbol boundaries. A given page can be read using a subset of the read levels positioned at symbol boundaries for that page.

For example, with respect to the lower page in FIG. 2, RL1, RL4, RL6, and RL11 are positioned at symbol boundaries between '1' and '0' bit encodings. Therefore, the data for the lower page may be obtained using four senses at each of read levels RL1, RL4, RL6, and RL11. For certain pages, fewer reads may be required to recover the bit encoding. For example, for the second intermediate page 201 in FIG. 2, the data for the page may be obtained using three senses at each of read levels RL2, RL8, and RL14. The term "page," or variations thereof, is used herein according to its broad and/or ordinary meaning. For example, "page" may refer to a block of a physical memory cells, or to the physical memory cells themselves. Furthermore, within a multi-level cell (MLC) (e.g., QLC), "page" may refer to an upper page, lower page, or intermediate page, which may in turn be associated with a respective bit position of a multi-bit encoding.

Figure 3:
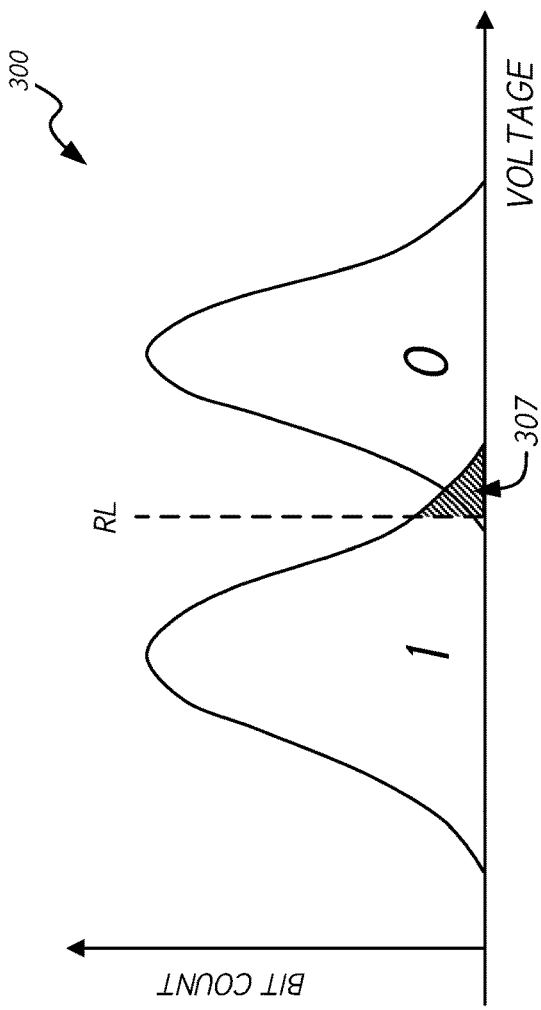
FIG. 3 is a graph illustrating a programming state distribution including overlapping programming states in accordance with one or more embodiments.

With respect to solid-state memory devices, variations in silicon processes and/or system trade-offs can result in some cells of a memory array being over- or under-programmed with respect to the target programming voltage. FIG. 3 illustrates an example voltage distribution 300 including overlapping distribution states, which may be a result of manufacturing, endurance, and/or data retention issues, as described above. While the diagram of FIG. 3 illustrates a two-state distribution, such distribution is provided for the purpose of simplification of description, and embodiments and features disclosed may be applicable to other types of coding schemes, such as QLC programming, as illustrated in FIG. 2. As shown in FIG. 3, a read of the distribution at read level RL may return incorrect information related to certain memory cells that have migrated across the symbol boundary at read level RL. For example, when reading cells of the '1' state distribution that have migrated to the right of the reference level RL, represented by the region 307, such read may incorrectly return a value of '0' for those cell(s). In hard decision decoding, fixed reliability information may be associated with cell reads. Therefore, additional reliability information may be unavailable which would indicate that the cells in region 307 are in error, or relatively likely to be in error. Soft bit data indicating whether a given memory cell has a charge level or other characteristic near the symbol boundary at RL may advantageously provide useful information for use in decoding the programmed data.

Soft bit data may be generated in a number of ways. Certain soft-decision solutions provide for additional data based on multiple hard-decision reads at additional reference voltages. In particular, additional reads may be performed to increase resolution in overlapping regions, where a significant portion of bit errors may occur. The region(s) where a large portion, or majority, of bit errors occur can vary from device-to-device.

Figure 4:
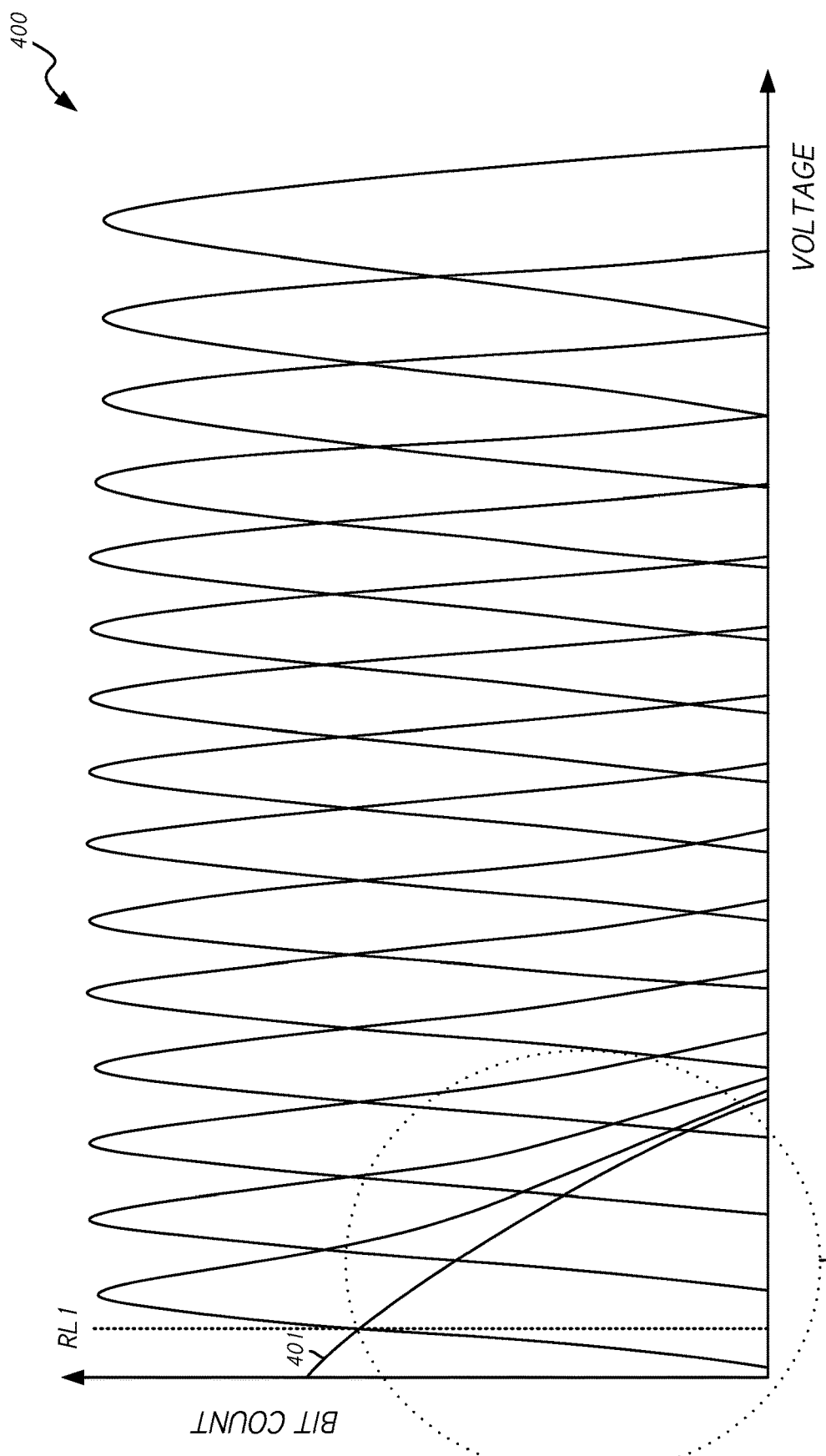
FIG. 4 is a graph illustrating a programming state distribution including an erase tail in accordance with one or more embodiments.

FIG. 4 is a graph showing a probability distribution 400 for programmed cells in a non-volatile memory array according to one or more embodiments. The represented distribution 400 includes an elongated erase tail 403 associated with an erase state 401. For example, for QLC programming, or other multi-level cell schemes, a relatively long erase tail may be caused by imperfections in a manufacturing process and may manifest in erased cells acquiring or retaining positive charge and thereby overlapping one or more adjacent memory states. More particularly, in certain embodiments, when a memory cell has a positive charge, in order to erase the cell, a negative voltage may be applied to draw the positive charge out of the cell. However, due to imperfections in the erase mechanism, some erased cells may retain some amount positive charge after being erased. Such positive charge retention can be manifest in an erase tail 401 as shown in FIG. 4, wherein the length of the erase tail can be related to the amount of positive charge that tends to remain in some erased cells. The overlap between the erase state and neighboring state(s) may result in an increase in bit error rate for pages that have symbol boundaries at or near the erase state. Therefore, for memory devices having an elongated erase tail, soft bit data that identifies cells in a region near the erase state symbol boundary can improve decoding capability.

In addition to erase tail issues, the ability to correctly decode data written to solid-state memory cells may be adversely affected by data-retention-related effects. For example, in prolonged storage applications, lack of data retention can lead to decoding failure. Furthermore, solid-state storage devices generally have limited endurance. That is, heavily-cycled blocks may have relatively shorter retention compared to similar lightly-cycled blocks. As a solid-state memory device is cycled, it may lose its data retention capabilities, thereby resulting in data loss. Because data retention issues can result in loss of charge in programmed memory cells, bit errors can occur as programmed cells migrate down across lower-voltage symbol boundary read levels. Such migration may occur in greater numbers with respect to higher-voltage programming states. Therefore, for memory devices suffering from retention issues, soft bit data that identifies cells in a region near the highest, or relatively high, programming state(s) and/or symbol boundary/boundaries can improve decoding capability.

In relatively high-read utilization use cases, read disturb may lead to decoding failures. Generally, read disturb errors may be due at least in part to charge gain, wherein charge is added to cells during a read of neighboring cell(s), thereby causing the cell charge level to migrate from one voltage level/state to the next-higher voltage state. The cells with the lowest voltage level(s) may tend to gain charge faster than cells at higher voltage levels due at least in part to the relatively lower voltage across the dielectric of the cells. Because of this, cells in the lowest voltage state (e.g., the erase state) may be impacted the most by read disturb. Therefore, for memory devices suffering from read disturb issues, soft bit data that identifies cells in a region near the lowest, or relatively low, programming state(s) and/or symbol boundary/boundaries can improve decoding capability.

Although solutions can be implemented to compensate for programming state overlapping, such as due to an elongated erase tail, by issuing a new full page read command to the non-volatile memory die with shifted read levels to get soft bit data when hard decision decoding fails, such solutions may introduce undesirable read latency. In some implementations, the present disclosure provides compensation for overlapping programming states by generating soft bit data or reliability data without the need for additional reads, thereby providing improved read latency.

Hard Decision Decoding

As described above, decoding of solid-state memory cells can be performed using hard decision decoding in some situations. For example, when attempting to decode data stored in solid-state memory cells, a decoder and/or controller may initially attempt to decode the data using hard decision decoding. For hard decision decoding, the controller may send a read command to a memory die, which may indicate a plurality of voltage read levels corresponding to certain symbol boundary threshold levels. In response, the memory die may sense the memory cells at the relevant read levels and provide data representative of bit encodings associated with the sensed charge levels, or other programmed characteristics. Such data may be considered hard bit data. In some embodiments, when the hard bit data provided to the controller is within the error correction capability of the decoder, the decoder may successfully decode the data using the hard bit data provided by the memory die.

Figure 5:
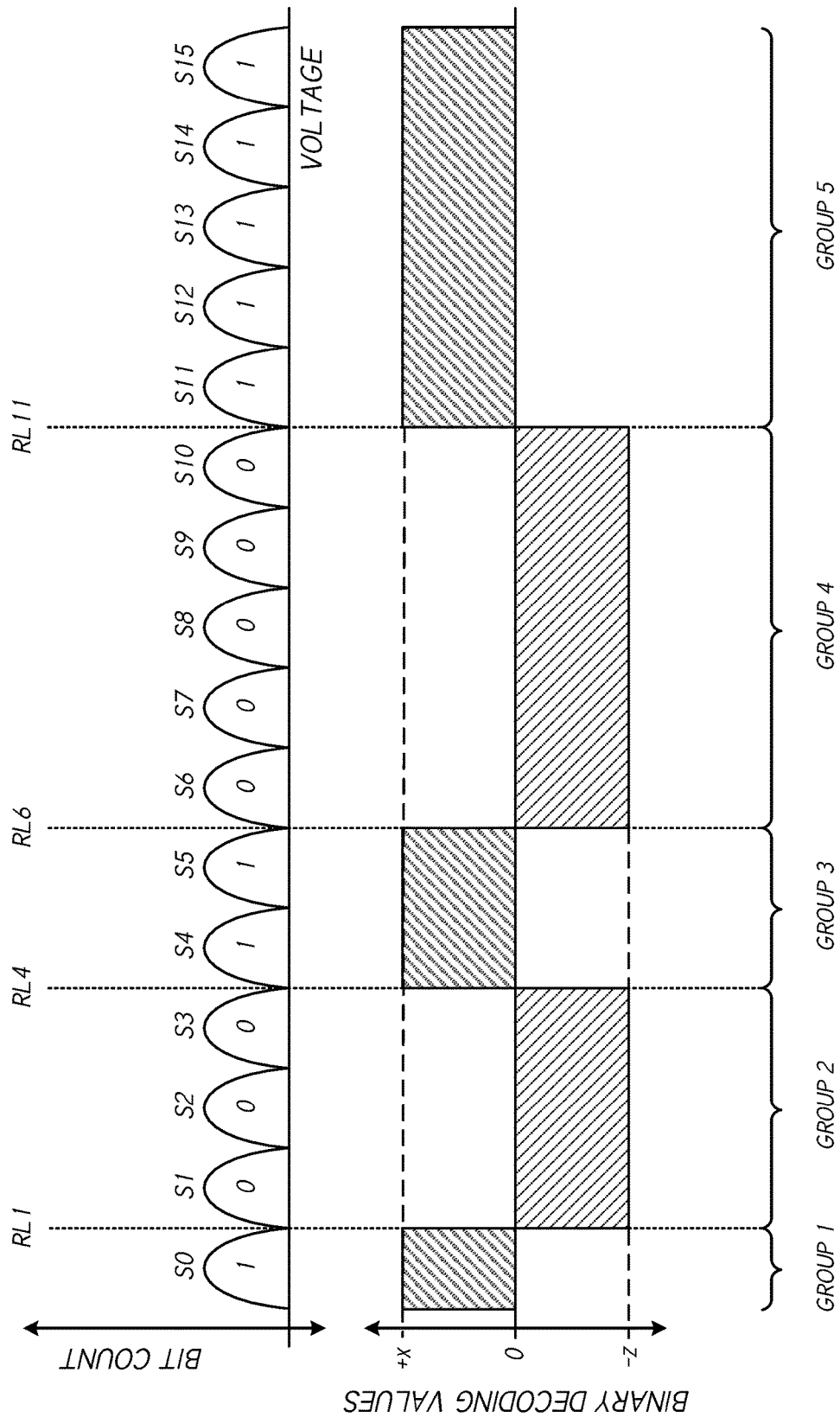
FIG. 5 illustrates a programming state distribution for a page of data and associated decoding value assignments in accordance with one or more embodiments.

Hard decision decoding processes may further be understood with reference to FIG. 5, which illustrates a programming state distribution for a single page of data in a multi-level programming scheme, such as a QLC programming scheme. The embodiment illustrated in FIG. 5 shows a particular bit encoding scheme in which four symbol boundaries ('RL1,' 'RL4,' 'RL6,' 'RL11') distinguish between '1' and '0' bit values. Although a particular bit encoding scheme is illustrated in FIG. 5, it should be understood that the principles disclosed herein are applicable to any bit encoding having any position and/or number of symbol boundaries. In order to determine the bit encodings for cells programmed according to the illustrated programming scheme, sense circuitry of a memory die may be configured to execute sense operations on the memory cells at each of the symbol boundary levels. For example, in some embodiments, in executing a single read command, sense circuitry of a memory die may sense charge levels of interrogated cells at each symbol boundary progressively from the lowest-voltage symbol boundary to the highest-voltage symbol boundary. Therefore, according to the illustrated embodiment, a single page read may be executed by first sensing charge levels or other characteristics of cells at RL1, which distinguishes the erase state 'S0' from the remaining states 'S1'-'S15', after which the higher-voltage symbol boundary read levels RL4, RL, and RL11, (or any other read threshold levels associated with symbol boundaries according to the relevant programming scheme) may be progressively used to sense the charge states of the memory cells.

As described above, hard decision decoding may involve assigning binary decoding values/voltages to memory cells representative of bit encodings. The decoder may use the binary values to decode the data. In transmitting and/or decoding the sensed data, a positive voltage/value 'x' may be used to represent cells having a first programming value (e.g., a '1' bit value, as shown in FIG. 5), whereas a negative voltage/value 'z' may be assigned to represent cells having a second programming value (e.g. a '0' value, as shown in FIG. 5).

The four symbol boundaries (RL1, RL4, RL6, RL11), as shown, may divide the memory cells into five distinct groups (Groups 1-5), each group associated with a '1' or '0' bit encoding value. For example, each of Groups 1, 3, and 5 may be associated with a '1' bit encoding value, whereas each of Groups 2 and 4 may be associated with a '0' bit encoding value. However, due to various factors described above, certain programming states and/or groups of states may be more susceptible to mis-programming, such as due to erase tail overlap or other condition(s). For example, although Group 2 and Group 4 are both associated with a '0' value, Group 2 may be more susceptible to mis-programming, wherein erased cells programmed to state S0 have charge levels greater than RL1, and therefore are incorrectly sensed in Group 2 and assigned a '0' rather than a '1' value. Because the programming states of Group 4 are farther removed from the erase state S0 than the programming states of Group 2, and likely have little or no overlap with the erase tail, the voltage range associated with Group 4 may be less likely to include mis-programmed data from adjacent group(s) than the voltage range associated with Group 2. That is, the cells with a charge level or characteristic associated with Group 2 may have a lower reliability than the cells with a charge level associated with Group 4.

Figure 6:
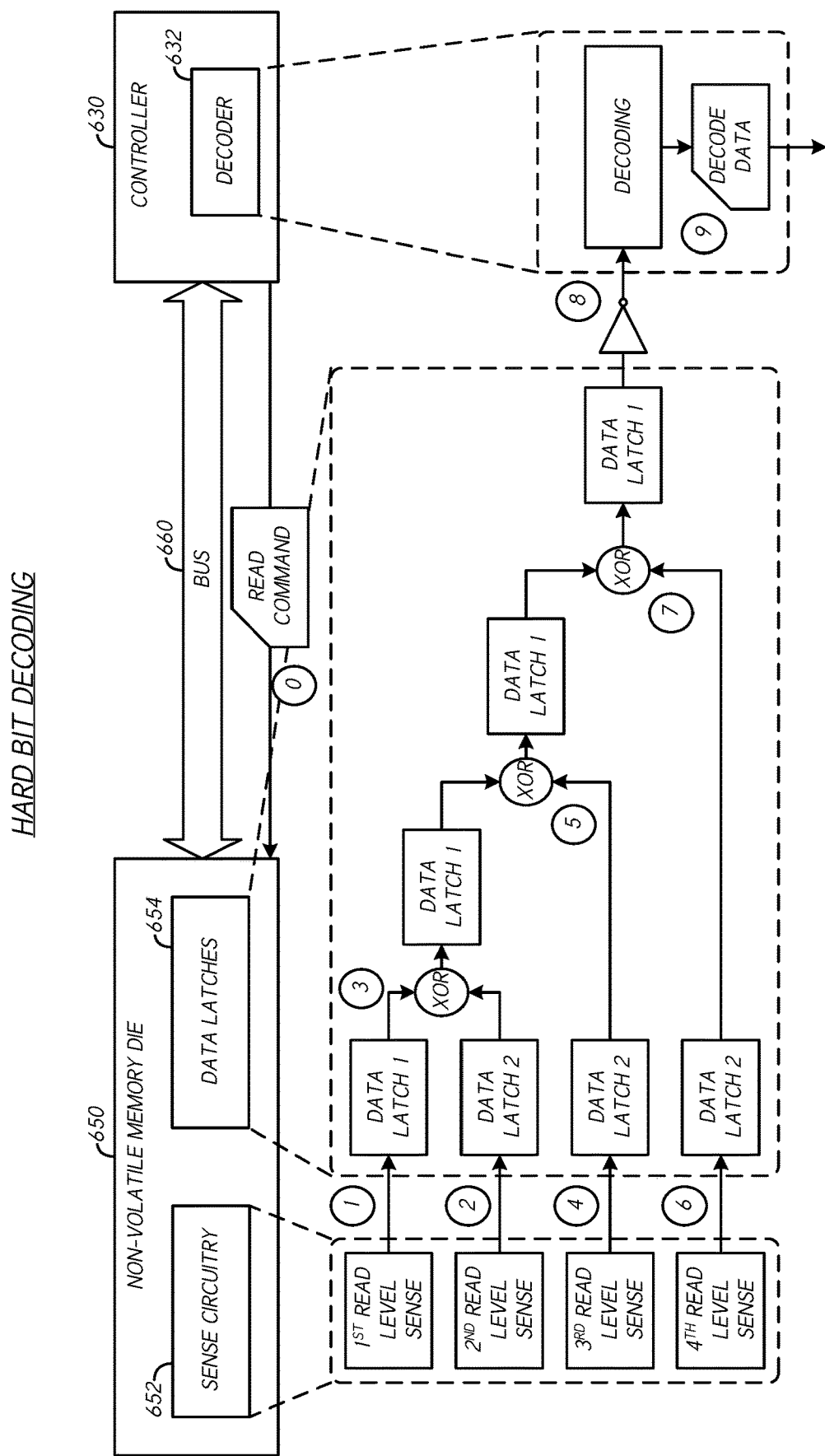
FIG. 6 is a block diagram illustrating a process for decoding memory cells using hard bit data in accordance with one or more embodiments.

FIG. 6 illustrates a process for decoding solid-state memory cells using hard decision decoding in accordance with one or more embodiments. The process illustrated in FIG. 6 can involve a memory controller 630 transmitting a read command to a non-volatile memory die 650. The transfer/receipt of the read command is identified in FIG. 6 as occurring at a time (0). Various figures presented herewith and described herein include circled numbers representative of points in time, or timestamps. The sequentially-numbered points in time may indicate temporally-sequential points in time. However, it should be understood that, with respect to any figure, the various operations/steps illustrated or described may have any temporal order. For example, within the scope of the present disclosure, for a given figure and associated description, one or more of the operations/steps associated with a particular relative point in time may be performed or occur out of order with respect to the indicated timestamp number(s). Furthermore, although points in time, times, and timestamps are described, it should be understood that such references may describe or refer to a period or range of time. Therefore, description of events or operations "at" a time may be understood to refer to events or operations occurring at any point during a period or range of time.

The read command may specify a plurality of voltage read levels (e.g., first ($1^{st}$), second ($2^{nd}$), third ($3^{rd}$), and fourth ($4^{th}$) read levels), which may advantageously correspond to symbol boundaries for a page of data stored in a plurality of memory cells in the non-volatile memory die 650. In response to the read command, the non-volatile memory die 650 may utilize sense circuitry 652 to execute a plurality of senses of the interrogated memory cells at the specified read levels. For example, such sense operations may be executed sequentially, starting with the lowest-voltage read level and progressing to the highest-voltage read level. For example, with reference back to FIG. 5, data for a single page, such as a lower page, may be obtained using four senses at the read levels RL1, RL4, RL6, and RL11, and data representative of the senses can be transferred to the controller 630 as a single data transfer from the non-volatile memory die 650 (time (8) in FIG. 6).

In executing the read command, the sense circuitry 652 may first execute a first sense of the interrogated memory cells at a first read level, as shown as time (1). Sensing the storage cells at a read level may involve generating a binary output based on the read level. For example, if a cell is charged to a level greater than the read level, the output generated in connection with the sense may be a '1' value (or '0' value). Therefore, with respect to the embodiment of FIG. 5, the first sense of the interrogated cells may produce data indicating whether each of the cells is programmed to a level above or below RL1. Therefore, the first sense (time (1)) may identify the subset of the interrogated cells that is program to the erase state S0.

The sense values generated at time (1) may be stored in a set of latches ('Data Latch 1'), wherein the set of data latches comprises a separate latch for each of the cells that was sensed. A "latch," as used herein, may comprise electronic circuitry configured to have two stable states, wherein a latch can be used to store binary state information. For example, each of the binary states of a latch may correspond to either a '0' or '1' bit encoding value. The term "latch" may be used herein to describe a single latch circuit, or a set of latch circuits each corresponding to a cell of a page or other quantity or segment of memory cells, such that the set of latches can store binary data corresponding to a page of sensed cells. According to the diagram of FIG. 6, after execution of the first sense at time (1), Data Latch 1 may comprise the data from the first sense operation. In some embodiments, the non-volatile memory die 650 comprises two sets of data latches, referred to in FIG. 6 as 'Data Latch 1,' and 'Data Latch 2,' respectively. It may generally be desirable to limit the number of sets of data latches of the non-volatile memory die 650, as such circuitry may require additional space and/or resources. Therefore, limiting the data latches 654 to two sets of data latches may be desirable in some embodiments.

At time (2), the process illustrated in FIG. 6 may involve sensing the memory cells at a second read level, such as at read level RL4 according to the embodiment of FIG. 5. With reference to FIG. 5, the second sense at read level RL4 may distinguish the cells in Groups 1 and 2 from the cells in Groups 3, 4, and 5. In some embodiments, the sense values from the second read may be stored in a second set of data latches (Data Latch 2), as shown.

At time (3), the process of FIG. 6 may involve executing a logical operation on the values stored in Data Latch 1 and Data Latch 2 using logical operator circuitry comprising one or more transistors, resistors, and/or other passive and/or active electronic devices. For example, at time (3), the non-volatile memory die 650 may use logical operator circuitry to execute an exclusive or (XOR) operation on data in Data Latch 1 and Data Latch 2. The output of the logical operation may be stored or maintained in Data Latch 1, thereby overwriting the data previously stored in Data Latch 1, and may indicate the memory cells that have a programmed state between the first read level and the second read level (e.g., Group 2 with respect to the embodiment of FIG. 5).

At time (4), the process of FIG. 6 may involve executing a third sense operation at a third read level. For example, with respect to the embodiment of FIG. 5, the third read level may correspond to read level RL6, separating Groups 1, 2, and 3 from Groups 4 and 5. The sense values may be stored in Data Latch 2, thereby overwriting the data previously stored in Data Latch 2.

At time (5), the process of FIG. 6 may involve executing a logical operation on the data in Data Latch 1 and the data in Data Latch 2, such as an XOR operation. The output from the logical operation may be stored or maintained in Data Latch 1, thereby overwriting the data previously stored in Data Latch 1 in connection with time (3). In some embodiments, the data stored in Data Latch 1 in connection with time (5) may indicate, either alone or in combination with data previously stored in Data Latch 1, cells having programmed states between the second and third read levels (e.g., Group 3 in the embodiment of FIG. 5). In certain embodiments, the data in Data Latch 1 at time (5) may indicate cells in Groups 3 and 1.

At time (6), the process of FIG. 6 involves executing a fourth sense operation at a fourth read level and storing the sense output in Data Latch 2, thereby overwriting the data stored in Data Latch 2 from the third sense operation. With respect to the embodiment of FIG. 5, for example, the fourth read level may correspond to read level RL11 and may distinguish the cells in Group 5 from the remaining cells.

At time (7), the process of FIG. 6 may involve executing a logical operation on data stored in Data Latch 1 and data stored in Data Latch 2, such as an XOR operation. The output from the logical operation may be stored or maintained in Data Latch 1, thereby overwriting the data previously stored in Data Latch 1 in connection with time (5). In some embodiments, the data stored in Data Latch 1 in connection with time (7) may indicate cells having a programmed state between the first and second read levels and between the third and fourth read levels. Therefore, with respect to the bit encoding scheme of FIG. 5, the data stored in Data Latch 1 at time (7) may indicate the bit values of all the cells for the relevant page, wherein cells in Groups 2 and 4 may be assigned one bit value (e.g. '0'), and the remaining cells may be assigned another bit value (e.g., '1'). Such data may be provided from the non-volatile memory die 650 to the controller 630 at time (8). In some embodiments, the data in Data Latch 1 at time (7) may be inverted, either at the non-volatile memory die 650 or the controller 630. The decoder 632 may use the data from the non-volatile memory die 652 to decode the memory cells and may provide a decoding decision at time (9).

With further reference to the embodiment of FIG. 5, two subsets (i.e., groups) of cells are assigned a first encoding value (e.g. '0'), such as Groups 2 and 4, whereas three other subsets of cells (e.g. Groups 1, 3, and 5) are assigned another encoding value (e.g. '1'). However, when the data indicating the programming values of the cells is provided from the non-volatile memory die 650 to the controller 630, the controller 630 and/or decoder 632 may be unable to distinguish between groups having similar encodings. For example, although the hard bit data provided by the non-volatile memory die 650 to the controller 630 may identify which cells belong to either of Groups 2 or 4, such data may not indicate, among those cells, which cells belong to Group 2 versus Group 4. Therefore, where it is desirable to identify cells in a single group, such as where one group may be considered less reliable than one or more other groups, soft bit data differentiating between groups with the same bit encoding value may be desired. However, in some implementations, only hard bit data, as in the process of FIG. 6, is provided in response to a read command from the controller 630, and it may be necessary for the controller 630 to issue additional page read commands when the hard bit data is insufficient to correctly decode the memory cells. Therefore, in some implementations, when hard bit decoding fails, the controller 630 may be configured to send a follow-on soft information read command to the non-volatile memory die 650. However, such additional page reads can increase read latency and/or increase traffic on the communication bus(es) 660 between the non-volatile memory die 650 and controller 630 and may therefore be undesirable. For example, execution of a new read command by the non-volatile memory die 650 may require circuit initialization, which adds read overhead. In some embodiments, the non-volatile memory die 650 and/or sense circuitry 652 may utilize one or more capacitors or other charge-storing elements/devices that are charged in order to provide the read level comparison voltage for sense operations. Therefore, additional read commands to generate soft bit data may require additional charging and/or discharging of such charge-storing elements, which may be undesirably inefficient.

As shown in FIG. 5, for hard decision decoding, the process of reading a page of data may involve transmission by the non-volatile memory die to the controller of only hard decision/bit data, which is used by the controller to decode and error correct the stored data. For each cell or bit, a reliability value, such as a log likelihood ratios (LLR) value, may be assigned, wherein the decoder uses such values to decode and/or error correct the data. Such assignment of reliability values may be performed by the decoder and/or the non-volatile memory die. Where only hard bit data is provided to the decoder, the reliability values assigned by the decoder may be binary, wherein one value is assigned to decoded '0's and another is assigned to decoded '1's. Therefore, the reliability values for hard decision decoding may not indicate a relative reliability of a given decoded '1' relative to other decoded '1's or for a given decoded '0' relative to other decoded '0's. However, in some solutions, hard decision decoding is implemented in order to provide improved latency based on the ability to obtain hard bit data without the need for additional read commands to generate soft decision reliability data. However, some embodiments disclosed herein advantageously provide for generation of soft decision reliability data without the need for additional read commands from the controller to the non-volatile memory die. For example, relative to the embodiment shown in FIGS. 5 and 6, certain embodiments disclosed herein provide modified read processes including one or more additional intermediate (e.g., mid-read) data transfers between the non-volatile memory die (e.g. flash chip) and the controller (e.g. SSD controller). Such extra transfer(s) can provide soft decision reliability data for use by the decoder of the controller, which may improve the correction capability of the decoder and/or increase an endurance of the data storage device. As used herein, "intermediate data transfer" refers to any transfer of data between a memory die and an external circuit, such as a controller, transferred prior transfer of a final read result. For example, where a non-volatile memory die is configured to provide a final hard decision read result to a controller in response to a read command, an intermediate data transfer may involve data, such as soft bit data, transferred prior to transfer of the final hard decision read result. A "final data transfer" refers to a transfer of the final hard decision read result, which may indicate the sensed bit encodings of memory cells. A "communication message," as used herein, refers to a transmission of data from one component of a data storage device or system, such as a non-volatile memory device, to another, such as a controller, and may comprise a data package, packet, container or other formatted unit or collection of data including control data and/or user data, or other payload.

Hard Bit Data and Soft Bit Data from Single Read

Figure 7:
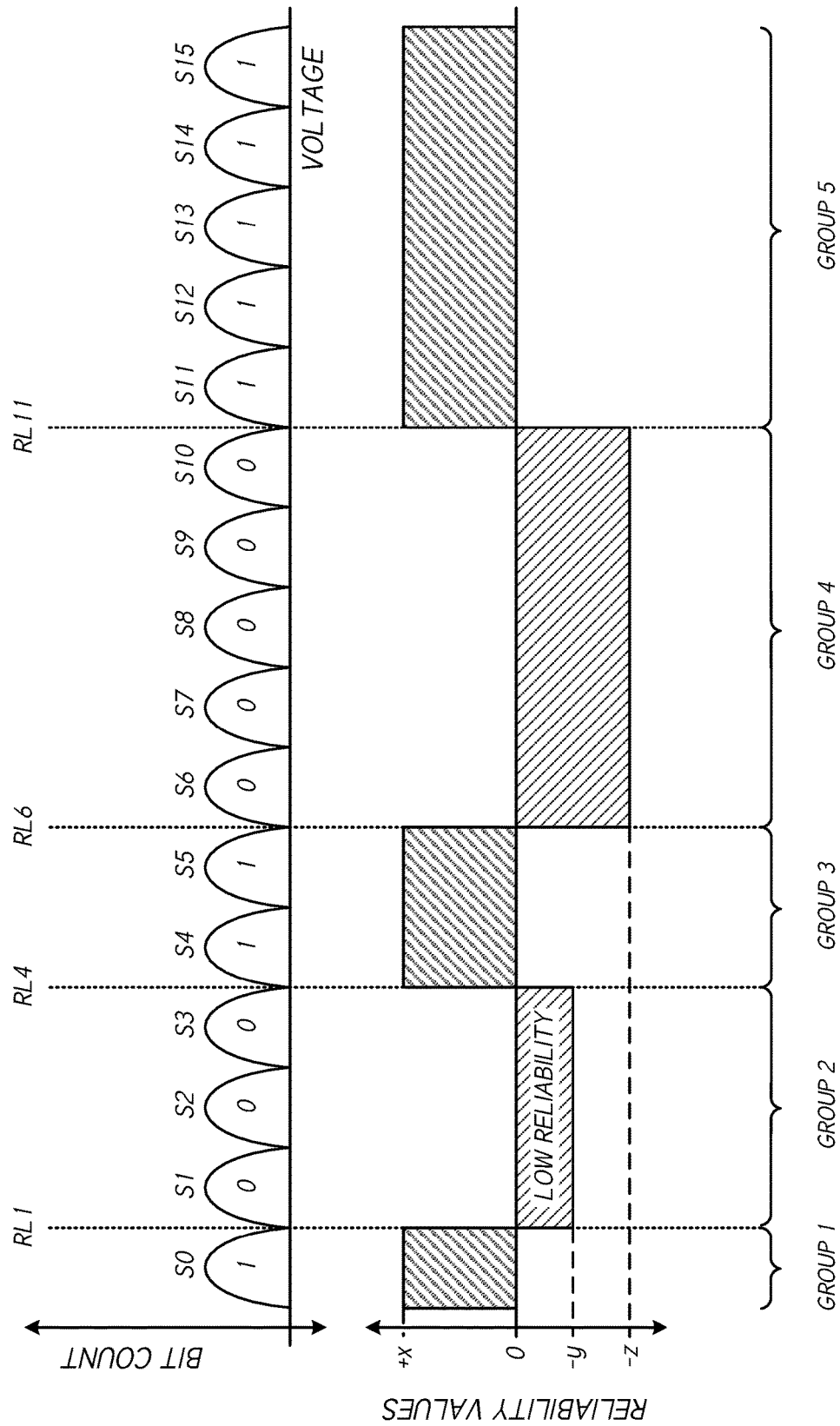
FIG. 7 illustrates a programming state distribution for a page of data and associated reliability value assignments in accordance with one or more embodiments.
Figure 8:
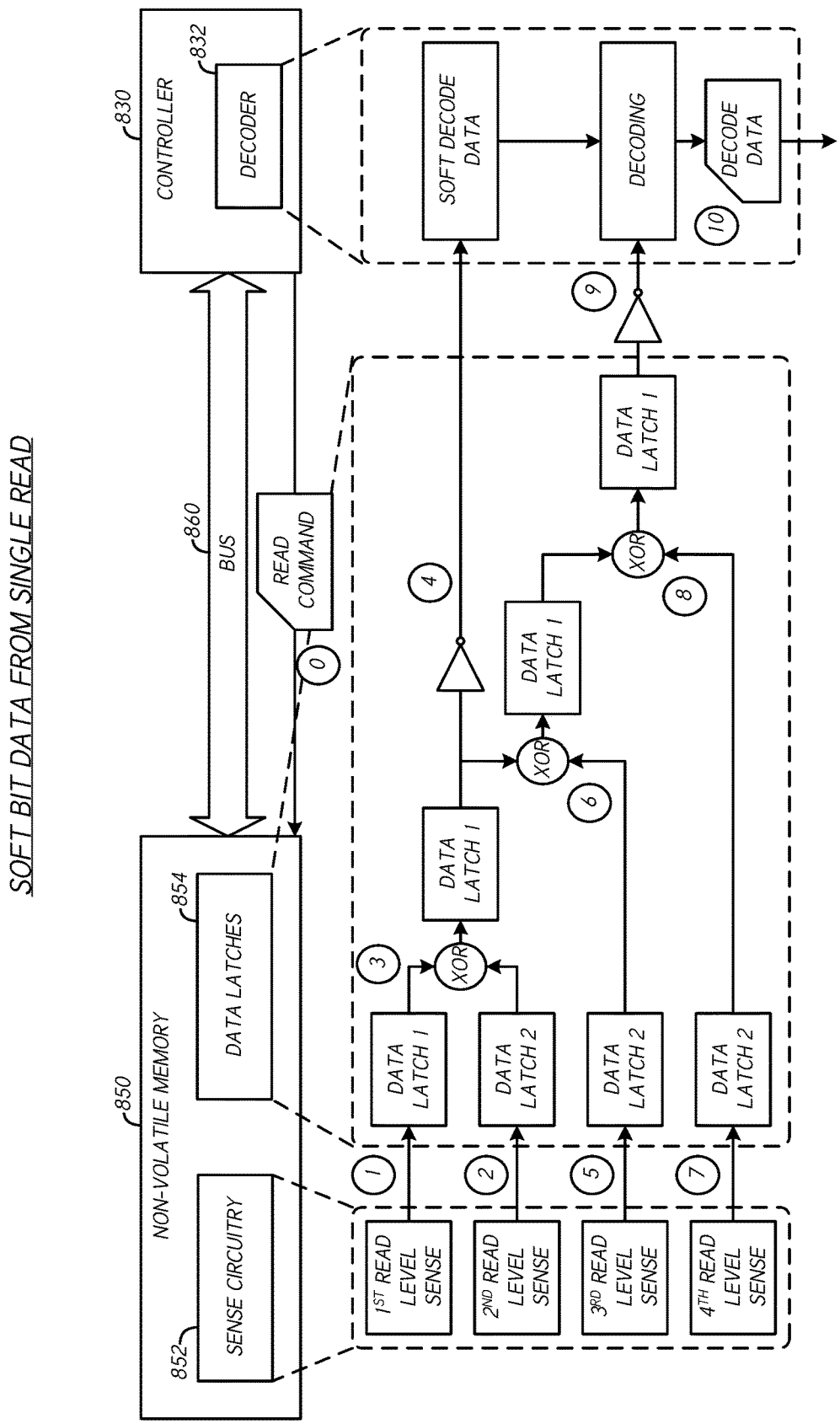
FIG. 8 is a block diagram illustrating a process for decoding memory cells using hard and soft bit data in accordance with one or more embodiments.

Embodiments of FIGS. 7 and 8 represent a modified mechanism for collecting soft bit data or other reliability data compared to solutions implementing additional read commands for soft bit data generation. For example, certain soft bit data generation solutions require additional full page reads to be executed in order to generate the soft bit data. Conversely, embodiments disclosed herein provide for soft bit data generation from a single read command, which may at least partially reduce the latency and/or improve the correction capability of the memory controller decoder. Such soft bit data generation may be implemented at least in part by implementing one or more additional intermediate data transfers from the non-volatile memory die to the controller. Generally, the effect of the time and/or communication interface utilization associated with such additional transfer(s) may be less than that associated with a full page read, which generally may require a plurality of senses and a data transfer. As additional read commands can reduce read latency, embodiments of the present disclosure may advantageously provide improved latency relative to other solutions. In some embodiments, a single additional intermediate data transfer may provide sufficient soft bit data or other reliability data for successful decoding and error correction by the decoder.

The example of FIG. 7 shows 16 voltage distributions corresponding to programming states 'S0'-'S15' for embodiments of quad level cell (QSC) programming. Generally, if a memory die or subsegment thereof suffers from, or is subject to, at least partially-distorted cell state distribution (e.g. due to data retention, read disturb, program disturb, and/or manufacturing defects), one or more additional transfers and associated soft bit data may be utilized for only those bits or cells impacted by the distortion, or impacted to a greater degree than other bits/cells. Therefore, embodiments disclosed herein may involve determination of a group of programming states that are susceptible to mis-programming, and intermediate data transfers may be implemented to provide soft bit data identifying such group(s). Groups of programming states, or individual programming states that are susceptible to mis-programming and/or are otherwise unreliable may be referred to as "error-prone" groups or programming states. Embodiments disclosed herein provide for the identification of memory cells or bits that fall in the error-prone states.

In some embodiments, a switch or other mechanism may be implemented at the non-volatile memory die to set or trigger one or more additional intermediate data transfer(s) associated with one or more error-prone group(s) or subset(s) of programming states. For example, if it is known that an undesirably long erase tail is present or affects a memory die or subsegment thereof, one or more additional data transfers may be implemented to identify a group or subgroup of programming states affected by the erase tail. For other groups or programming states that have the same bit encoding, but are determined to not be as affected or susceptible to the erase tail or other distortion of the programming state distribution, such group(s) and/or cells may not be accounted for specifically in the soft decision data transfer.

Although certain embodiments are disclosed herein in the context of decoding a lower page of data in a multi-level cell programming scheme, it should be understood that principles disclosed herein are applicable to any page of data, including upper page and/or intermediate page(s). Depending on the particular page being decoded and the bit encoding scheme implemented, symbol boundaries and the groups of programming states that are identified as unreliable may vary for different embodiments.

FIG. 8 illustrates a process for decoding solid-state memory cells using hard and soft decision decoding from a single read in accordance with one or more embodiments. The process illustrated in FIG. 8 can involve a memory controller 830 transmitting a read command to a non-volatile memory die 850. The transfer/receipt of the read command is identified in FIG. 8 as occurring at a time (0). The read command may specify a plurality of voltage read levels (e.g., first ($1^{st}$), second ($2^{nd}$), third ($3^{rd}$), and fourth ($4^{th}$) read levels), which may advantageously correspond to symbol boundaries for a page of data stored in a plurality of memory cells in the non-volatile memory die 850. In response to the read command, the non-volatile memory die 850 may utilize sense circuitry 852 to execute a plurality of senses of the interrogated memory cells at the specified read levels. For example, such sense operations may be executed sequentially, starting with the lowest-voltage read level and progressing to the highest-voltage read level. For example, with reference to FIG. 7, data for a single page, such as a lower page, may be obtained using four senses at the read levels RL1, RL4, RL6, and RL11, and data representative of the senses can be transferred to the controller 830 as a single data transfer from the non-volatile memory die 850 (time (9) in FIG. 8).

In executing the read command, the sense circuitry 852 may first execute a first sense of the interrogated memory cells at a first read level, as shown as time (1). With respect to the embodiment of FIG. 7, the first sense of the interrogated cells may produce data indicating whether each of the cells has a programmed state that is greater than or less than RL1. Therefore, the first sense (time (1)) may identify the subset of the interrogated cells that are program to the erase state S0.

The sense values generated at time (1) may be stored in a set of latches ('Data Latch 1'). Therefore, according to the diagram of FIG. 8, after execution of the first sense at time (1), Data Latch 1 may comprise the data from the first sense operation identifying the subset of cells that are programmed to the erase state S0. In some embodiments, the non-volatile memory die 850 comprises two sets of data latches, referred to in FIG. 8 as 'Data Latch 1,' and 'Data Latch 2,' respectively.

At time (2), the process illustrated in FIG. 8 may involve sensing the memory cells at a second read level, such as at read level RL4 according to the embodiment of FIG. 7. With reference to FIG. 7, the second sense at read level RL4 may distinguish the cells in Groups 1 and 2 from the cells in Groups 3, 4, and 5. In some embodiments, the sense values from the second read may be stored in a second set of data latches (Data Latch 2), as shown.

At time (3), the process of FIG. 8 may involve executing a logical operation on the values stored in Data Latch 1 and Data Latch 2 using logical operator circuitry comprising one or more transistors, resistors, and/or other passive and/or active electronic devices. For example, at time (3), the non-volatile memory die 850 may use logical operator circuitry to execute an exclusive or (XOR) operation on data in Data Latch 1 and Data Latch 2. The output of the logical operation may be stored or maintained in Data Latch 1, thereby overwriting the data previously stored in Data Latch 1, and may indicate the memory cells that have a programmed state between the first read level and the second read level (e.g., Group 2 with respect to the embodiment of FIG. 7). Therefore, with respect to the embodiment of FIG. 7, the data stored in Data Latch 1 at time (3) may indicate the cells having a programmed state in Group 2, which are determined to be relatively unreliable. It may be desirable to assign a reliability value (e.g., LLR) to such bits/cells that indicates the unreliability (e.g., a reliability value having an absolute value less than the maximum and/or minimum reliability value(s); i.e., the value −y as shown in FIG. 7).

At time (4), the process of FIG. 8 may involve transferring the values stored in Data Latch 1 (or an inverted version thereof) to the controller 830 and/or decoder 832. Because the data stored in Data Latch 1 immediately prior to the transfer identifies bits/cells that are error-prone, or have low reliability, the data transferred can provide soft bit data for decoding the memory cells. The decoder 832 and/or controller 830 may comprise data storage for storing and/or maintaining intermediate transferred bits of data, wherein the decoder 832 may utilize such data when performing decoding and/or error correction. At the decoder 832, the bits or cells identified in the transfer at time (4) may be assigned a reliability value −y, which may be closer to zero than the value −z, which may be a highest reliability value.

The intermediate transferred data may be used as soft decision reliability data. For example, after hard bit data is provided from the non-volatile memory die 850 (in connection with time (9), discussed in detail below), the decoder 832 may use the hard bit data and the soft bit data to generate a decoding decision (e.g., at time (10)). The hard bit data provided at time (9) may be considered the read result from the non-volatile memory array 850 in response to the read command. By using both the soft bit data and hard bit data, the decoder 832 may be able to generate an improved decoding result. Although the soft bit data (e.g., reliability indication) transfer (4) is shown and described herein as an intermediate transfer separate from the final hard bit data (e.g., bit encoding) transfer (9), it should be understood that the communication circuit of the non-volatile memory 850 may be configured to communicate the hard bit data (9) and the soft bit data (4) in a single communication message.

At time (5), the process of FIG. 8 may involve executing a third sense operation at a third read level. For example, with respect to the embodiment of FIG. 7, the third read level may correspond to read level RL6, separating Groups 1, 2, and 3 from Groups 4 and 5. The sense values may be stored in Data Latch 2, thereby overwriting the data previously stored in Data Latch 2.

At time (6), the process of FIG. 8 may involve executing a logical operation on the data in Data Latch 1 and the data in Data Latch 2, such as an XOR operation. The output from the logical operation may be stored or maintained in Data Latch 1, thereby overwriting the data previously stored in Data Latch 1 in connection with time (3) (and transferred at time (4)). In some embodiments, the data stored in Data Latch 1 in connection with time (6) may indicate, either alone or in combination with data previously stored in Data Latch 1, cells having programmed states between the second and third read levels (e.g., Group 3 in the embodiment of FIG. 7). In certain embodiments, the data in Data Latch 1 at time (6) may indicate cells in Groups 3 and 1.

Generally, it may be necessary for the transfer associated with time (4) to occur prior to the XOR operation associated with time (6), as the data resulting from the logical operation at time (6) may overwrite the previously-stored data in Data Latch 1, which is the data transferred in connection with time (4) in some embodiments. That is, where intermediate soft bit data (or other reliability data) transfers are implemented from a set of data latches (e.g., Data Latch 1) during a read operation, timely transmission of such data may be necessary to avoid overwriting of the data that is desired to be transferred. In some embodiments, the data latches 854 include more than two sets of data latches, such that intermediate data may not be overwritten prior to completion of the read operation.

The transfer at time (4) may serve to target just those bits that are detected between the first and second read levels, which may have low reliability based on the scheme of FIG. 7 and the presence of an elongated erase tail. Where a substantial portion of the mis-programmed cells belong to in a single group, such as Group 2 in the illustrated embodiment, improved decoding may be achieved through the use of a single additional transfer, namely the transfer shown at time (4), or a transfer of another time or from another set of data latches.

At time (7), the process of FIG. 8 involves executing a fourth sense operation at a fourth read level and storing the sense output in Data Latch 2, thereby overwriting the data stored in Data Latch 2 from the third sense operation. With respect to the embodiment of FIG. 7, for example, the fourth read level may correspond to read level RL11 and may distinguish the cells in Group 5 from the remaining cells.

At time (8), the process of FIG. 8 may involve executing a logical operation on data stored in Data Latch 1 and data stored in Data Latch 2, such as an XOR operation. The output from the logical operation may be stored or maintained in Data Latch 1, thereby overwriting the data previously stored in Data Latch 1 in connection with time (6). In some embodiments, the data stored in Data Latch 1 in connection with time (8) may indicate cells having a programmed state between the first and second read levels and between the third and fourth read levels. Therefore, with respect to the bit encoding scheme of FIG. 7, the data stored in Data Latch 1 at time (8) may indicate the bit values of all the cells for the relevant page, wherein cells in Groups 2 and 4 may be assigned one bit value (e.g. '0'), and the remaining cells may be assigned another bit value (e.g., '1'). Such data may be provided from the non-volatile memory die 650 to the controller 630 at time (9). In some embodiments, the data in Data Latch 1 at time (8) may be inverted, either at the non-volatile memory die 650 or the controller 630. The decoder 632 may use the soft bit data transferred from the non-volatile memory die 652 in the intermediate transfer at time 4 and in the final hard decision transfer at time (9) to decode the memory cells and may provide a decoding decision at time (10).

Multiple Soft Decoding Levels from Single Read

Although the embodiment illustrated in FIGS. 7 and 8 involves three different reliability values, namely +x, −y, and −z (see FIG. 7), embodiments of the present disclosure may provide for assignment of any number of different reliability (LLR) values or soft bit data. In order to determine more than three reliability values, more than one additional intermediate soft bit data (or other reliability data) transfer may be desired or necessary. For example, FIGS. 9 and 10 illustrate a decoding process involving multiple intermediate soft bit data transfers.

Figure 9:
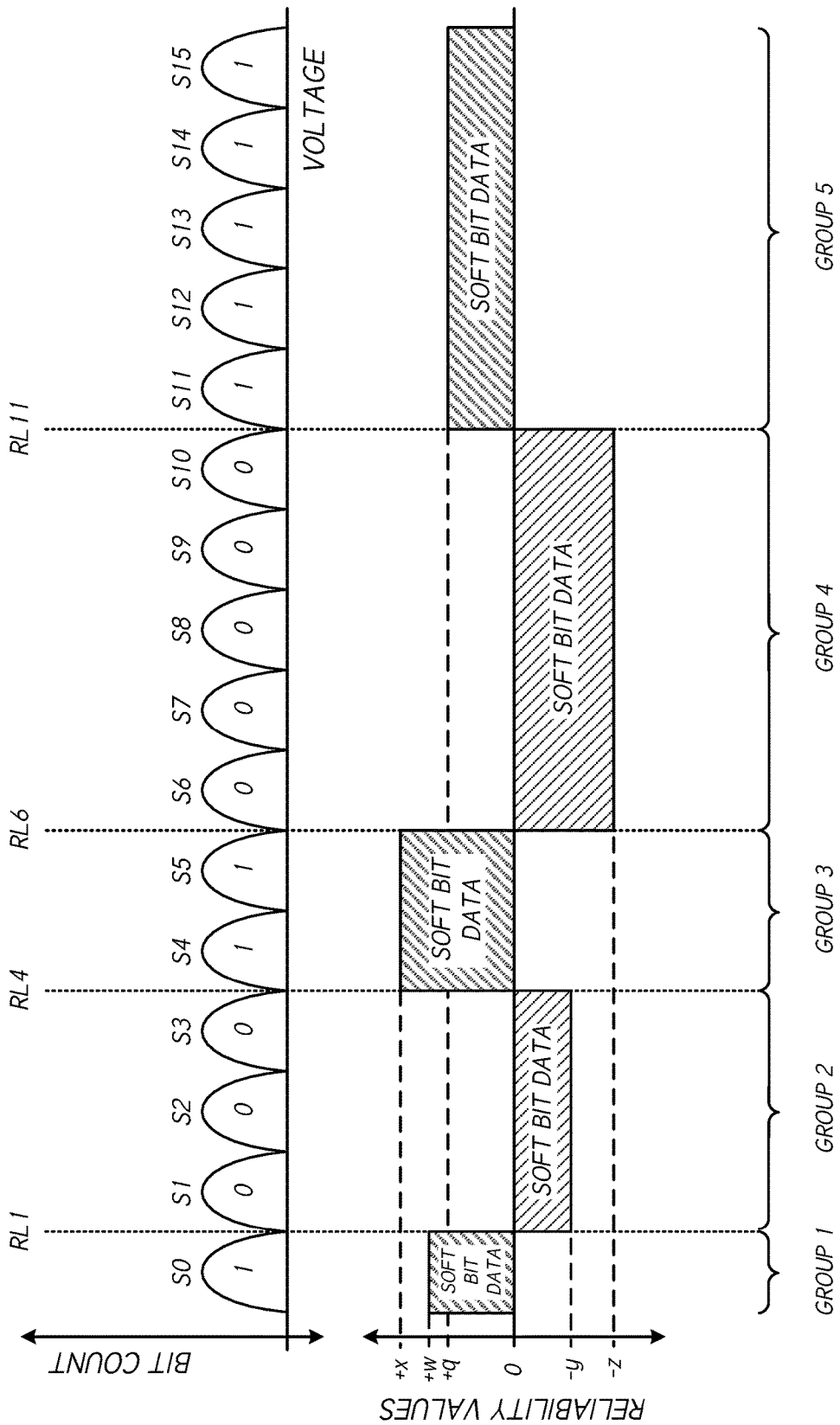
FIG. 9 illustrates a programming state distribution for a page of data and associated reliability value assignments in accordance with one or more embodiments.

FIG. 9 illustrates a programming state distribution for a single page of data in a multi-level programming scheme, such as a QLC programming scheme. In the embodiment of FIG. 9, multiple different reliability values (e.g., LLR) are assigned to the various groups of programming states. FIG. 10 illustrates a process for decoding solid-state memory cells using hard bit data and multiple soft bit data transfers or levels from a single read in accordance with one or more embodiments. In the example QLC programming scheme of FIGS. 9 and 10, two, three, or four additional intermediate soft bit data transfers may be implemented to identify up to five distinct groups of cells (or more in other implementations), which may each be assigned a different reliability value for decoding purposes. Furthermore, where such intermediate soft bit data transfers occur temporally prior to the relevant data latch being overwritten in connection with a subsequent operation, such soft decision functionality may be implemented with a limited number of sets of data latches, such as two sets of data latches in the illustrated embodiment of FIG. 10.

Figure 10:
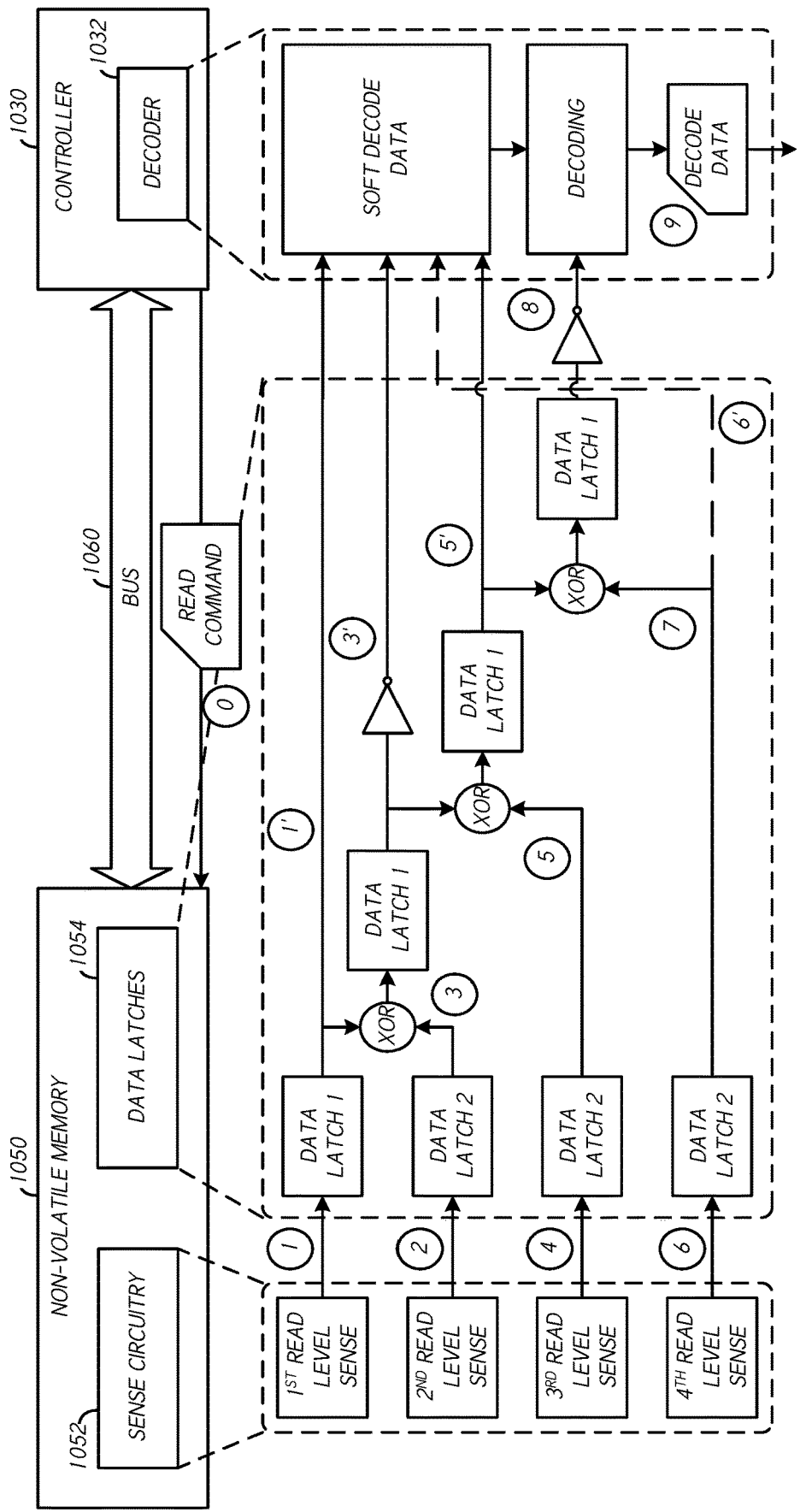
FIG. 10 is a block diagram illustrating a process for decoding memory cells using hard and soft bit data in accordance with one or more embodiments.

The process illustrated in FIG. 10 can involve a memory controller 1030 transmitting a read command to a non-volatile memory die 1050. The transfer/receipt of the read command is identified in FIG. 10 as occurring at a time (0). The read command may specify a plurality of voltage read levels (e.g., first ($1^{st}$), second ($2^{nd}$), third ($3^{rd}$), and fourth ($4^{th}$) read levels), which may advantageously correspond to symbol boundaries for a page of data stored in a plurality of memory cells in the non-volatile memory die 1050. In response to the read command, the non-volatile memory die 1050 may utilize sense circuitry 1052 to execute a plurality of senses of the interrogated memory cells at the specified read levels. For example, such sense operations may be executed sequentially, starting with the lowest-voltage read level and progressing to the highest-voltage read level. For example, with reference to FIG. 9, data for a single page, such as a lower page, may be obtained using four senses at the read levels RL1, RL4, RL6, and RL11, and data representative of the senses can be transferred to the controller 1030 as a single data transfer from the non-volatile memory die 1050 (time (8) in FIG. 10).

In executing the read command, the sense circuitry 1052 may first execute a first sense of the interrogated memory cells at a first read level, as shown as time (1). With respect to the embodiment of FIG. 9, the first sense of the interrogated cells may produce data indicating whether each of the cells has a programmed state that is greater than or less than RL1. Therefore, the first sense (time (1)) may identify the subset of the interrogated cells that are program to the erase state S0.

The sense values generated at time (1) may be stored in a set of latches ('Data Latch 1'). Therefore, according to the diagram of FIG. 10, after execution of the first sense at time (1), Data Latch 1 may comprise the data from the first sense operation identifying the subset of cells that are programmed to the erase state S0. In some embodiments, the non-volatile memory die 1050 comprises two sets of data latches, referred to in FIG. 10 as 'Data Latch 1,' and 'Data Latch 2,' respectively.

As the data maintained in Data Latch 1 at time (1) indicates the subset of cells that are charged to the erase state (i.e., Group 1 with respect to FIG. 9), the data values stored in Data Latch 1 at time (1) may be transferred at time (1') from the non-volatile memory die 1050 to the controller 1030 over the bus 1060 prior to completion of the read operation. At the decoder 1032, the bits or cells identified in the transfer at time (1') may be assigned a first reliability value, such as a value +w, as shown in FIG. 9. The value +w may be less than the value +x, which may be a highest positive reliability value. The decoder 1032 and/or controller 1030 may comprise data storage for storing and/or maintaining intermediate transferred bits of data, wherein the decoder 1032 may utilize such data when performing decoding and/or error correction.

Reliability values may be determined and/or selected based on the model representing the programming state distribution of the non-volatile memory die 1050 or portion thereof. For example, in some embodiments, cells or groups may be assigned a reliability value that has an absolute value less than the maximum reliability values (e.g. +x, −z) by an amount that reflects the relative reliability of the cells compared to the most reliable group(s) or cells. In some embodiments, the reliability values for each of the identified groups are values between −1 and +1 (e.g. +x=+1, −z=−1). Any number of additional intermediate transfers may be implemented based on the particular model of the programming state distribution. Each of the additional intermediate transfers may be considered intermediate soft bit data results for a single read or sequence of senses.

At time (2), the process illustrated in FIG. 10 may involve sensing the memory cells at a second read level, such as at read level RL4 according to the embodiment of FIG. 9. With reference to FIG. 9, the second sense at read level RL4 may distinguish the cells in Groups 1 and 2 from the cells in Groups 3, 4, and 5. In some embodiments, the sense values from the second read may be stored in a second set of data latches (Data Latch 2), as shown.

At time (3), the process of FIG. 10 may involve executing a logical operation on the values stored in Data Latch 1 and Data Latch 2 using logical operator circuitry comprising one or more transistors, resistors, and/or other passive and/or active electronic devices. For example, at time (3), the non-volatile memory die 1050 may use logical operator circuitry to execute an exclusive or (XOR) operation on data in Data Latch 1 and Data Latch 2. The output of the logical operation may be stored or maintained in Data Latch 1, thereby overwriting the data previously stored in Data Latch 1, and may indicate the memory cells that have a programmed state between the first read level and the second read level (e.g., Group 2 with respect to the embodiment of FIG. 9).

At time (3'), the process of FIG. 10 may involve an intermediate transfer of the values stored in Data Latch 1 (or an inverted version thereof) to the controller 1030 and/or decoder 1032. The bits or cells identified in the transfer at time (4) may be assigned a reliability value −y (e.g., at the decoder), which may be closer to zero than the value −z, which may be a highest reliability value.

At time (4), the process of FIG. 10 may involve executing a third sense operation at a third read level. For example, with respect to the embodiment of FIG. 9, the third read level may correspond to read level RL6, separating Groups 1, 2, and 3 from Groups 4 and 5. The sense values may be stored in Data Latch 2, thereby overwriting the data previously stored in Data Latch 2.

At time (5), the process of FIG. 10 may involve executing a logical operation on the data in Data Latch 1 and the data in Data Latch 2, such as an XOR operation. The output from the logical operation may be stored or maintained in Data Latch 1, thereby overwriting the data previously stored in Data Latch 1 in connection with time (3) (and transferred at time (3')). In some embodiments, the data stored in Data Latch 1 in connection with time (5) may indicate, either alone or in combination with data previously stored in (and/or transferred from) Data Latch 1, cells having charge states between the second and third read levels (e.g., Group 3 in the embodiment of FIG. 9). In certain embodiments, the data in Data Latch 1 at time (5) may indicate cells in Groups 3 and 1.

The process of FIG. 10 may involve an intermediate transfer at time (5'). The intermediate transfer at time (5') may involve a transfer of the data from Data Latch 1, or an inverted version of the data stored in Data Latch 1. The data stored in Data Latch 1 at a time (5) may indicate the cells stored in Group 3 and/or Group 1. For example, in some embodiments, the data stored in Data Latch 1 at time (5) identifies the cells charged to a level between the second read level and the third read level (i.e., Group 3), as well as the cells having a charge state below the first read level i.e., Group 1). Therefore, as the first intermediate transfer at time (1') identifies the cells with a programmed state below the first read level (i.e., Group 1), in combination with the transfer at time one (1'), the transfer at time (5') may be used to identify the cells with a programmed state between the second and third read levels (e.g., Group 3 in FIG. 9), as distinguished from the cells with a programmed state below the first read level. Although the soft bit data (e.g., reliability indication) transfers (1'), (3'), (5') are shown and described herein as intermediate transfers separate from the final hard bit data (e.g., bit encoding) transfer (8), it should be understood that the communication circuit of the non-volatile memory 1050 may be configured to communicate the hard bit data (8) and the soft bit data (1'), (3'), (5') in a single communication message.

Therefore, in some embodiments, the identification of each of the five distinct groups shown in FIG. 9 may be determined using three additional intermediate transfers. That is, in some embodiments, the additional transfer at time (6') identifying the cells in Group 5 may not be necessary in order to identify all five distinct groups. For example, the identification of the five distinct groups (e.g., Groups 1-5 in FIG. 9) may be as follows: the cells belonging to Group 1 may be identified based on the intermediate transfer at time (1') from Data Latch 1, which is based on the sense at the first read level; the cells belonging to Group 2 and having a programmed state between the first read level and the second read level may be identified based on the intermediate transfer at time (3') (e.g., in view of the transfer at time (1')); the cells belonging to Group 3 and having a programmed state between the second and third read levels may be identified based on the transfer at time (5'), which identifies the cells in Groups 3 and 1, taking into account the cells identified in the transfer at time (1'), which identifies the cells with a programmed state in Group 1. That is, the transfer at time (5') minus the transfer time (1') may provide identification of the cells in Group 3.

Memory cells belonging to Group 4 and having a programmed state between the third and fourth read levels may be identified based on the final hard read transfer at time (8) (or an inverted version thereof), which identifies the cells in Groups 2 and 4, taking into account the previously identified cells in Group 2 transferred at time (3'). That is, the transfer at time (8) (or an inverted version thereof, such as the data stored in Data Latch 1 prior to the transfer at time (8)) minus the transfer at time (3') may provide identification of the cells in Group 4.

Memory cells belonging to Group 5 may be identified based on the final hard read transfer at time (8), which identifies the cells in Groups 1, 3, and 5, taking into account the previously identified cells in Groups 1 and 3 transferred at time (5'). That is, the transfer at time (8) minus the transfer at time (5') may provide identification identifying or indicating the cells in Group 5. Alternatively, the cells belonging to Group 5 may be identified based on the additional intermediate transfer at time (6') from Data Latch 2.

Soft Information from Single Read Using Additional Sense and Additional Transfer Embodiments disclosed above allow for the generation and provision of soft bit data or other reliability data in addition to hard bit data in connection with a single read command/operation. Additionally or alternatively, soft bit data can be generated using one or more additional sense operations. For example, such additional sense operations may not be specified in the read command from the controller but may be implemented by the non-volatile memory die independently or in response to an indication from the host or controller to implement mis-programming compensation in accordance with embodiments of the present disclosure. For example, an additional read threshold sense operation can be included in a sense sequence to obtain higher resolution soft bit data relating to one or more cells or groups of cells. Such additional read sense can be implemented in connection with a single page read command. By implementing an additional sense operation, rather than requiring a new read command specifying soft information read levels, time and/or resource savings may be achieved.

As described above, with respect to a programming state distribution, a subset of programming states thereof may be determined to be adjacent or near to a read level that may be prone to errors/mis-programming. As an example, a long erase tail can affect one or more programming states adjacent to a symbol boundary (e.g., RL1) distinguishing the erase state from the remaining states. Where a plurality of programming states belong to a group of programming states between the symbol boundary of concern and the next highest (or lowest) symbol boundary (e.g., read level), the degree to which the erase tail or distortion of the distribution affects the individual programming states in the group may vary. For example, the programming states of the group may be progressively less affected by the distortion moving away from the symbol boundary of concern. Therefore, the programming state immediately adjacent to the symbol boundary of concern may be more error-prone than one or more other programming states of the group. Furthermore, a portion of a programming state that is relatively closer to the symbol boundary of concern than another portion thereof may be more error-prone than other portions of the programming state and/or other programming states of the group.

In some implementations, an additional sense is performed between symbol boundaries, and particularly, between a symbol boundary of concern and a next higher (or lower) symbol boundary. Such additional sense may be performed as part of a single read operation together with a plurality of additional sense operations at symbol boundaries designed to provide hard bit data. The additional soft decision sense between symbol boundaries may be used to distinguish a subgroup of programming states of the group adjacent to the symbol boundary of concern, or a portion of a programming state of the group adjacent to the symbol boundary of concern, for designation as low reliability. The additional sense between symbol boundaries may provide relatively high-resolution soft bit data that can be used to improve the correction capability of the decoder. A read level between symbol boundaries, such as a read level associated with an additional sense as described herein, may be referred to as an "additional read level."

The implementation of a soft decision read between symbol boundaries as part of execution of a hard decision read command can provide various benefits. For example, as described above, certain solutions implement soft decision decoding by issuing and executing follow-on soft decision read commands when hard decision decoding fails. However, such follow-on read commands may require sense circuitry initialization as well as additional time and resources. For example, in some implementations, the time to execute a read command may involve first initializing sense circuitry, and further sensing the cells being interrogated at a plurality of read levels associated with the page being read. A page read command with four read levels may take approximately 230 µs to be executed, whereas an additional sense at a read level between symbol boundaries in accordance with embodiments of the present disclosure may require only approximately 30 µs, or less. Therefore, implementation of one or more additional soft decision senses as part of a hard decision read command may take relatively less time and/or resources to implement, and therefore may be more efficient mechanism for obtaining soft bit data.

Figure 11:
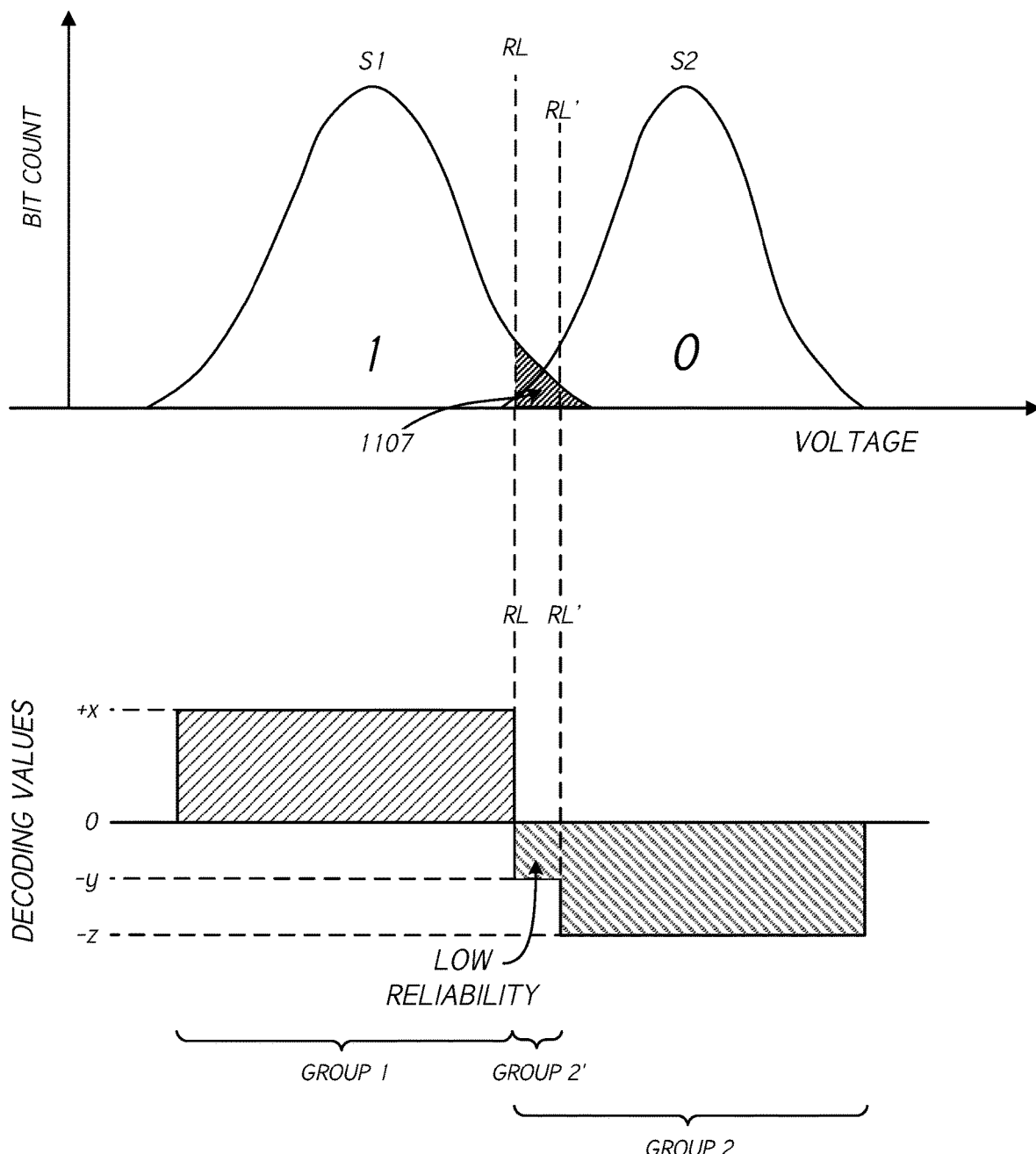
FIG. 11 illustrates a programming state distribution and associated reliability value assignments in accordance with one or more embodiments.

FIG. 11 illustrates an example voltage distribution including a symbol boundary 'RL' designed to distinguish between a first state 'S1' and a second state 'S2.' Although only two programming states are shown, it should be understood that the distribution of FIG. 11 may have any number of programming states and symbol boundaries. As shown, the distribution of FIG. 11 is at least partially distorted, wherein a portion 1107 of the cells programmed to state S1 have programmed states beyond the symbol boundary RL, and therefore are mis-programmed to the state S2.

FIG. 11 shows an additional soft decision sense read level RL', which may be used to identify a subgroup (Group 2') of the adjacent group of cells or programming states that are designated as low reliability and assigned a reliability value −y, which may have an absolute value less than the maximum and minimum reliability values (+x, −z). Although the additional sense RL' is shown as only partially overlapping a single adjacent state S2, it should be understood that the additional soft decision sense RL' may be positioned at any suitable or desirable position, and may include within the Group 2' a portion of the immediately adjacent state S2, or may include the entire immediately adjacent state S2 and/or at least a portion of one or more additional programming states (e.g., to the right of state S2 with the respect to the embodiment of FIG. 11) of the group between the symbol boundary RL and the next symbol boundary (e.g. next-highest (or lowest) symbol boundary). In some embodiments, the voltage level associated with the additional sense RL' may be determined or selected in order to maximize the error correcting capability of the decoder. For example, an optimal location of the additional sense RL' may be determined through modeling of the memory die or portion thereof as a binary communication channel. The additional read level RL' is positioned between symbol boundaries (e.g., between the symbol boundary at read level RL and a next-higher, or next-lower, symbol boundary). For example, with reference back to the programming distribution of FIG. 5, an additional read level may be any read level positioned in any of the illustrated groups (i.e., Groups 1-5), and may overlap a programming state, or may be positioned between programming states of a single group.

With respect to initialization of the sense circuitry to perform the additional sense at read level RL', the charging or changing of voltage from the symbol boundary read level RL to the additional sense read level RL' may be considerably faster than the initialization time required in connection with executing an entirely new read command. For example, in order to initialize a sense capacitor from RL to RL', it may not be necessary to discharge the sense capacitor(s), and therefore less time may be required compared to execution of a new read command.

Although the distribution of FIG. 11 shows RL' on the positive voltage side of the symbol boundary RL (i.e., to the right of RL), it should be understood that the additional sense RL' may be positioned anywhere on the voltage spectrum/distribution, depending on the type of distortion being compensated for. For example, where data retention distortion is present, such distortion may present with an elongated lower tail of the highest-voltage programming state(s). Therefore, a symbol boundary distinguishing the highest programming state or group associated therewith from lower programming states and/or groups may be the symbol boundary of concern. In such an embodiment, the additional sense RL' may be positioned at a lower voltage than the symbol boundary of concern (e.g., to the left of the symbol boundary of concern).

Figure 12:
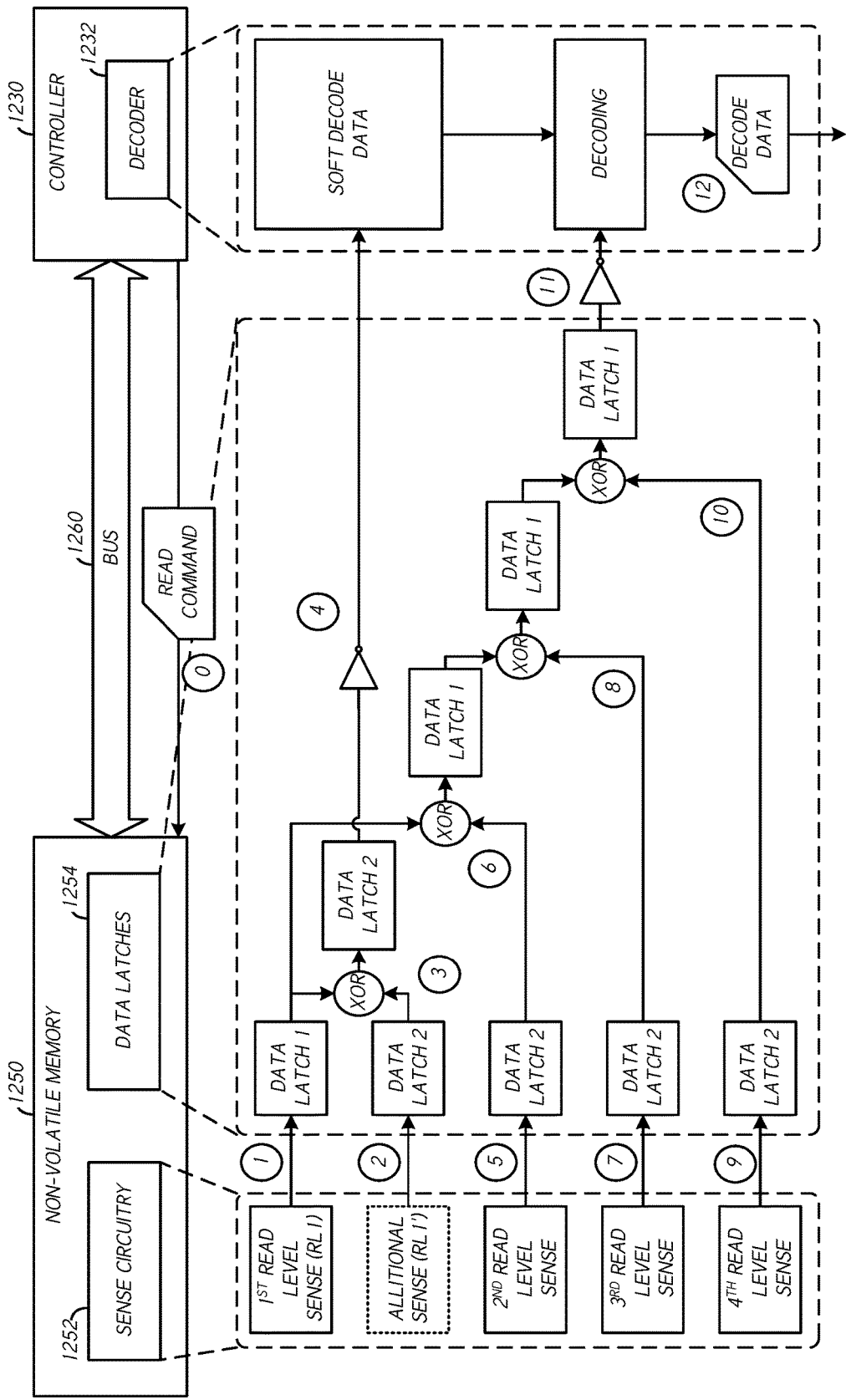
FIG. 12 is a flow diagram illustrating a process for decoding memory cells using hard and soft bit data in accordance with one or more embodiments.

FIG. 12 illustrates a process for decoding solid-state memory cells using hard and soft decision decoding from a single read in accordance with one or more embodiments. The process illustrated in FIG. 12 can involve a memory controller 1230 transmitting a read command to a non-volatile memory die 1250. The transfer/receipt of the read command is identified in FIG. 12 as occurring at a time (0). The read command may specify a plurality of voltage read levels (e.g., first ($1^{st}$), second ($2^{nd}$), third ($3^{rd}$), and fourth ($4^{th}$) read levels), which may advantageously correspond to symbol boundaries for a page of data stored in a plurality of memory cells in the non-volatile memory die 1250. In response to the read command, the non-volatile memory die 1250 may utilize sense circuitry 1252 to execute a plurality of senses of the interrogated memory cells at the specified read levels. For example, such sense operations may be executed sequentially, starting with the lowest-voltage read level and progressing to the highest-voltage read level. Data representative of the senses can be transferred to the controller 1230 as a single data transfer from the non-volatile memory die 1250 (time (11) in FIG. 12).

In executing the read command, the sense circuitry 1252 may first execute a first sense of the interrogated memory cells at a first read level, as shown as time (1). The sense values generated at time (1) may be stored in a set of latches ('Data Latch 1'). Therefore, according to the diagram of FIG. 12, after execution of the first sense at time (1), Data Latch 1 may comprise the data from the first sense operation identifying the subset of cells that are programmed to as state lower than the first read level. In some embodiments, the non-volatile memory die 1250 comprises two sets of data latches, referred to in FIG. 12 as 'Data Latch 1,' and 'Data Latch 2,' respectively.

At time (2), the process of FIG. 12 involves performing an additional sense RL1' between the first read level and the second read level. For example, in some implementations, the first and second read levels are positioned at symbol boundaries, whereas the additional sense RL1' is positioned between the symbol boundaries of the first read level and the second read level. The sense values associated with the additional sense at read level RL' may be stored in the second set data latches (Data Latch 2). At time (3), a logical operation may be performed on the data in Data Latch 1 and the data in Data Latch 2. The results of such logical operation (e.g. XOR operation) may indicate the cells that have a programmed state between the first read level and the additional sense read level RL1'. As described above, the cells in this additional group between the first read level and the additional sense read level RL' can be assigned a lower reliability value by the controller 1230 and/or decoder 1232. The data identifying the cells between the first read level RL1 and the additional sense read level RL1' may advantageously be stored in the second set of data latches (Data Latch 2) to avoid overwriting the data stored in Data Latch 1, which is based on the first read level at time (3).

At time (4), the process of FIG. 12 involves transmitting or providing the data indicating the cells in the group between the first read level and the additional sense read level RL' to the controller as an additional transfer in addition to the final hard bit data transfer at time (11) (described below). Although FIG. 12 illustrates a single additional sense (RL1') and a single additional soft bit data transfer (transfer at time (4)), it should be understood that embodiments the present disclosure may include any number of additional senses and data transfers. Furthermore, additional senses may be implemented between any of the symbol-boundary senses (e.g., the second, third, and/or fourth read levels). Although the soft bit data (e.g., reliability indication) transfer (4) is shown and described herein as an intermediate transfer separate from the final hard bit data (e.g., bit encoding) transfer (11), it should be understood that the communication circuit of the non-volatile memory 1250 may be configured to communicate the hard bit data (11) and the soft bit data (4) in a single communication message.

At time (5), the process illustrated in FIG. 12 may involve sensing the memory cells at a second read level. In some embodiments, the sense values from the second read may be stored in Data Latch 2, thereby overwriting the previously-stored data from the additional sense at time (2).

At time (6), the process of FIG. 12 may involve executing a logical operation on the values stored in Data Latch 1 and Data Latch 2 using logical operator circuitry comprising one or more transistors, resistors, and/or other passive and/or active electronic devices. For example, at time (3), the non-volatile memory die 1250 may use logical operator circuitry to execute an exclusive or (XOR) operation on data in Data Latch 1 and Data Latch 2. Because the data based on the additional sense (RL') and the first read level sense was stored in Data Latch 2 at time (3), rather than Data Latch 1, immediately prior to time (6), Data Latch 1 still may store data representative of the first sense at the first read level.

The decoder 1232 may maintain the additional soft bit data received with the transfer at time (4) together with subsequently received hard bit data (at time (11)) to provide improved decoding from a single read operation. For example, although some solutions involve executing a hard decision read including the first, second, third, and fourth read level senses (or any other number of senses/read levels), and performs a follow-on soft decision read in the event that the hard decision decoding fails, embodiments of the present disclosure implement a soft decision sense between symbol boundaries together with the hard decision read level senses (e.g., at symbol boundaries) as part of execution of a single read command. That is, the non-volatile memory die 1250 may be configured to provide soft bit data in the absence of a hard decision decoding failure, but rather may implement soft decision decoding as a matter of course. In some embodiments the controller 1230 specifies the additional sense read level in the read command. Alternatively, the non-volatile memory die 1250 may be configured to implement the additional sense without indication or specification thereof in the read command. The non-volatile memory die 1250 may implement the soft bit data generation and/or transmission substantially independently of the controller 1230 and/or read command.

In some embodiments, additional soft decision senses and/or data transfers in accordance with embodiments of the present disclosure may be implemented using a special command (e.g., vendor-specific command), which may be utilized by the controller (or host system) at or in anticipation of an end of life state of the non-volatile memory die. For example, a controller in accordance with embodiments the present disclosure may be configured to determine that a non-volatile memory die is approaching or at an end of life state, wherein in response to such determination, the controller may issue modified read commands to the non-volatile memory die indicating that combination hard and soft decision read is to be implemented, including one or more additional senses and/or additional intermediate data transfers.

Additional Embodiments

Those skilled in the art will appreciate that in some embodiments, other types of data storage systems and/or current suppression schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Methods and processes described herein may be embodied in, and partially or fully automated via, software code modules executed by one or more general and/or special purpose computers. The word "module" may refer to logic embodied in hardware and/or firmware, or to a collection of software instructions, possibly having entry and exit points, written in a programming language, such as, for example, C or C++. A software module may be compiled and linked into an executable program, installed in a dynamically linked library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an erasable programmable read-only memory (EPROM). "Module" may further refer to one or more devices, components, systems, or subsystems, which may conceptually implement relevant functionality. It will be further appreciated that hardware modules may be comprised of connected logic units, such as gates and flip-flops, and/or may be comprised of programmable units, such as programmable gate arrays, application specific integrated circuits, and/or processors. The modules described herein are preferably implemented as software modules but may be represented in hardware and/or firmware. Moreover, although in some embodiments a module may be separately compiled, in other embodiments a module may represent a subset of instructions of a separately compiled program and may not have an interface available to other logical program units.

What is claimed is:

1. An apparatus comprising:
a control circuit configured to connect to a non-volatile memory array having a plurality of memory cells, wherein the control circuit is configured to:
sense a group of the memory cells at a plurality of read levels;
determine a bit encoding for the memory cells based on sensing the group at the plurality of read levels; and
send a response to a read command that indicates the bit encoding and identifies a subset of the group that were sensed as being in one or more error-prone data states.

2. The apparatus of claim 1, wherein the control circuit is configured to determine the subset of the group based on the sensing for at least two of the plurality of read levels.

3. The apparatus of claim 1, wherein the control circuit is configured to determine the subset of the group based on the sensing for less than all of the plurality of read levels.

4. The apparatus of claim 1, wherein the control circuit is configured to communicate the bit encoding and the identification of the subset of the group in a single communication message to a memory controller.

5. The apparatus of claim 1, wherein the control circuit:
communicates the identification of the subset of the group in an intermediate data transfer to a memory controller; and
communicates the bit encoding in a final data transfer to the memory controller.

6. The apparatus of claim 1, wherein the control circuit communicates the identification of the subset of the group to a memory controller before communicating the bit encoding for the plurality of memory cells to the memory controller.

7. The apparatus of claim 1, wherein the one or more error-prone data states comprise a plurality of adjacent data states having a common bit encoding for at least one page.

8. The apparatus of claim 1, wherein:
the plurality of read levels are positioned at symbol boundaries; and
the control circuit is further configured to sense the plurality of memory cells at an additional read level in response to the read command.

9. The apparatus of claim 1, wherein:
the read command includes a request for a particular page of data;
the bit encoding includes a bit for each memory cell in the group for the particular page of data; and
the one or more error-prone data states comprise a plurality of adjacent data states having a common bit encoding for the particular page of data.

10. The apparatus of claim 1, further comprising a plurality of data latches, wherein the control circuit is configured to:
store a value from sensing at each of the plurality of read levels in a different one of latches;
perform logical operations on the data in all of the latches to generate the bit encoding for the memory cells; and
perform a logical operation on the data in less than all of the latches to determine the subset of the group that were sensed as being in the one or more error-prone data states.

11. A method comprising:
receiving a read command from a memory controller;
sensing a group of memory cells in a non-volatile memory die at a plurality of read levels in response to receiving the read command;
determining a bit encoding for the memory cells based on sensing the group at the plurality of read levels;
identifying, based on the sensing for at least two of the plurality of read levels, a subset of the group that are in one or more error-prone data states; and
sending a response to the read command to the memory controller that indicates the bit encoding and identifies the subset of the group.

12. The method of claim 11, wherein:
the bit encoding specifies a bit for each memory cell in the group for a particular page that was requested in the read command; and
the one or more error-prone data states comprise a plurality of adjacent data states having a common bit encoding for the particular page.

13. The method of claim 12, wherein identifying, based on the sensing for at least two of the plurality of read levels, the subset of the group that are in the one or more error-prone data states comprises:
identifying the subset based on sensing for less than all of the plurality of read levels.

14. An apparatus comprising:
a communication circuit configured to receive a read command from a memory controller; and
a control circuit coupled to the communication circuit, wherein the control circuit is configured to connect to a non-volatile memory array having a plurality of memory cells, wherein the control circuit is configured to:
sense a group of the memory cells at a plurality of read levels in response to the read command, wherein the plurality of read levels are positioned at symbol boundaries for a page;
determine hard bit data for the page based on sensing the group at the plurality of read levels; and
determine soft bit data based on sensing the group at two or more of the plurality of read levels;
wherein the communication circuit is configured to send the hard bit data and the soft bit data to the memory controller in response to the read command.

15. The apparatus of claim 14, wherein the hard bit data comprises one bit of data for each memory cell in the group for a first page of data.

16. The apparatus of claim 15, wherein the soft bit data comprises one bit of data for each memory cell in the group that indicates whether the memory cell was sensed as being in a particular set of adjacent data states having a common bit encoding for the first page of data.

17. The apparatus of claim 15, wherein the soft bit data comprises:
   one bit of data for each memory cell in the group that indicates whether the memory cell was sensed as being in a first particular set of adjacent data states having a common bit encoding for the first page of data; and
   one bit of data for each memory cell in the group that indicates whether the memory cell was sensed as being in a second particular set of adjacent data states having a common bit encoding for the first page of data.

18. The apparatus of claim 14, wherein the control circuit comprises a plurality of data latches, wherein the control circuit is configured to:
   store a value from sensing at each of the plurality of read levels in a different one of latches;
   perform logical operations on the data in all of the latches to generate the hard bit data; and
   perform a logical operation on the data in less than all of the latches to generate the soft bit data.

19. The apparatus of claim 14, wherein the communication circuit is configured to communicate the soft bit data to the memory controller prior to communicating the hard bit data to the memory controller.

20. The apparatus of claim 14, wherein the communication circuit is configured to communicate the soft bit data with the hard bit data in a single communication message to the memory controller.

* * * * *